/ United States Patent (12)
Hu et al.

(10) Patent No.: US 9,666,597 B2
(45) Date of Patent: May 30, 2017

(54) SEMICONDUCTOR MEMORY DEVICE

(71) Applicant: Kabushiki Kaisha Toshiba, Minato-ku (JP)

(72) Inventors: Ming Hu, Yokkaichi (JP); Toshiyuki Takewaki, Yokkaichi (JP); Shingo Nakajima, Yokkaichi (JP); Hiroyasu Tanaka, Yokkaichi (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/057,333

(22) Filed: Mar. 1, 2016

(65) Prior Publication Data

US 2017/0077130 A1     Mar. 16, 2017

Related U.S. Application Data

(60) Provisional application No. 62/216,857, filed on Sep. 10, 2015.

(51) Int. Cl.
| | |
|---|---|
| *H01L 29/76* | (2006.01) |
| *H01L 27/11582* | (2017.01) |
| *H01L 27/11565* | (2017.01) |
| *H01L 23/522* | (2006.01) |
| *H01L 23/528* | (2006.01) |
| *H01L 23/532* | (2006.01) |

(52) U.S. Cl.
CPC .... *H01L 27/11582* (2013.01); *H01L 23/5226* (2013.01); *H01L 23/5283* (2013.01); *H01L 23/5329* (2013.01); *H01L 27/11565* (2013.01)

(58) Field of Classification Search
CPC ......... H01L 27/11582; H01L 27/11565; H01L 23/5226; H01L 23/5283; H01L 23/5329

USPC .................................................... 257/314
See application file for complete search history.

(56) References Cited

U.S. PATENT DOCUMENTS

| | | | |
|---|---|---|---|
| 6,503,795 B2 | 1/2003 | Cha | |
| 7,910,914 B2 | 3/2011 | Tanaka et al. | |
| 7,936,004 B2 | 5/2011 | Kito et al. | |
| 8,551,838 B2 | 10/2013 | Kito et al. | |
| 9,064,735 B2 | 6/2015 | Kito et al. | |
| 9,443,868 B1 | 9/2016 | Hu et al. | |
| 2011/0220987 A1* | 9/2011 | Tanaka ............. | H01L 27/11575 257/324 |

(Continued)

FOREIGN PATENT DOCUMENTS

JP     2008-16546     1/2008

*Primary Examiner* — Tu-Tu Ho
(74) *Attorney, Agent, or Firm* — Oblon, McClelland, Maier & Neustadt, L.L.P.

(57) ABSTRACT

According to one embodiment, a semiconductor memory device includes a stacked body; a semiconductor body; a charge storage layer; a first conductor; a second conductor; and a third conductor. The stacked body includes a plurality of electrode layers stacked with an insulator interposed. The semiconductor body extends along a stacking direction of the stacked body. The first conductor is provided in the stacked body. The first conductor is in contact with the substrate. The second conductor includes a different material from the first conductor. The second conductor is in contact with a first portion of the first conductor. The third conductor includes a same material as the second conductor. The third conductor is in contact with a second portion of the first conductor.

16 Claims, 25 Drawing Sheets

(56) References Cited

U.S. PATENT DOCUMENTS

| | | |
|---|---|---|
| 2012/0098050 A1 | 4/2012 | Shim et al. |
| 2012/0241842 A1 | 9/2012 | Matsuda |
| 2014/0014889 A1 | 1/2014 | Shim et al. |
| 2015/0372006 A1 | 12/2015 | Kito et al. |

* cited by examiner

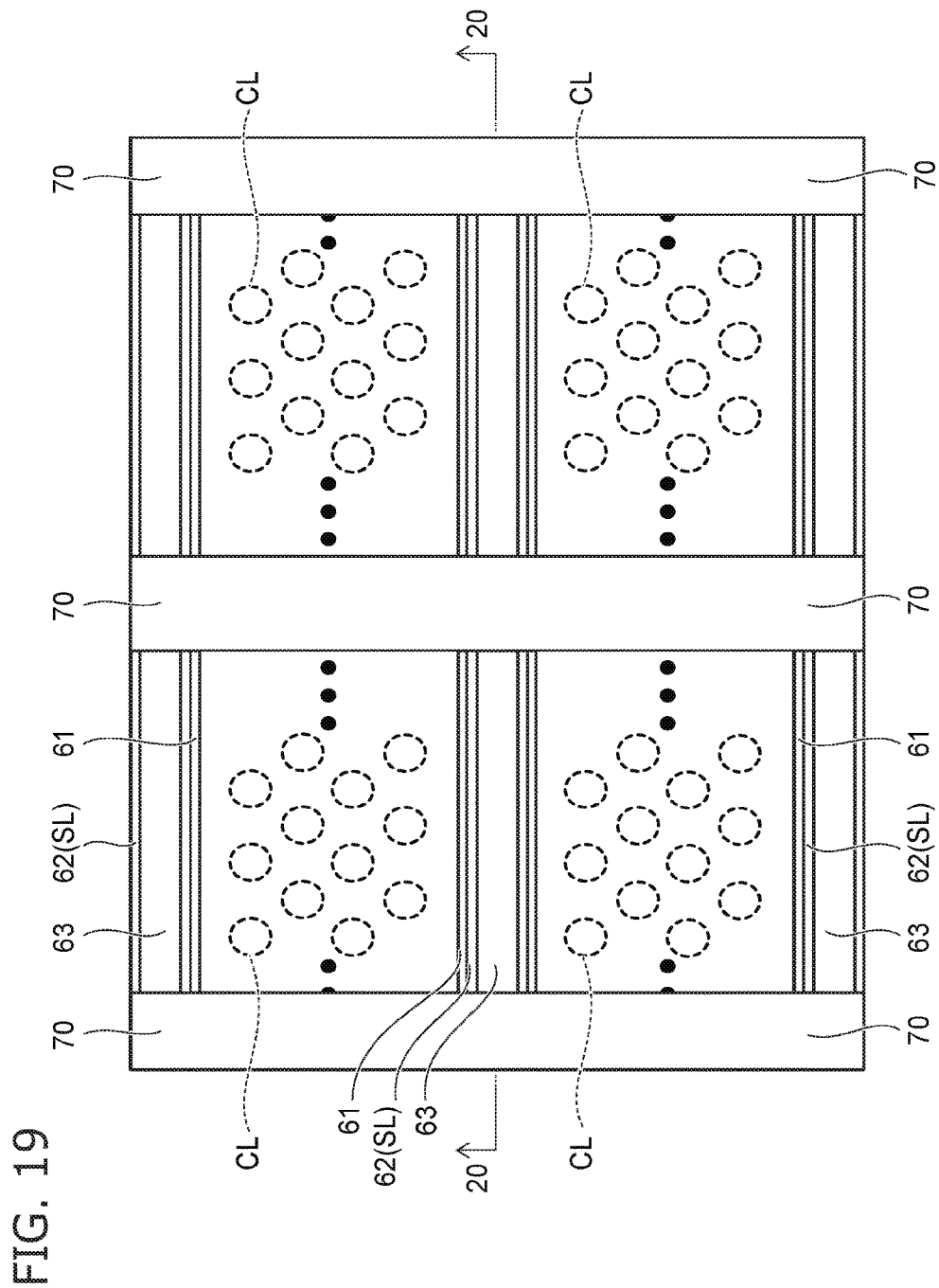

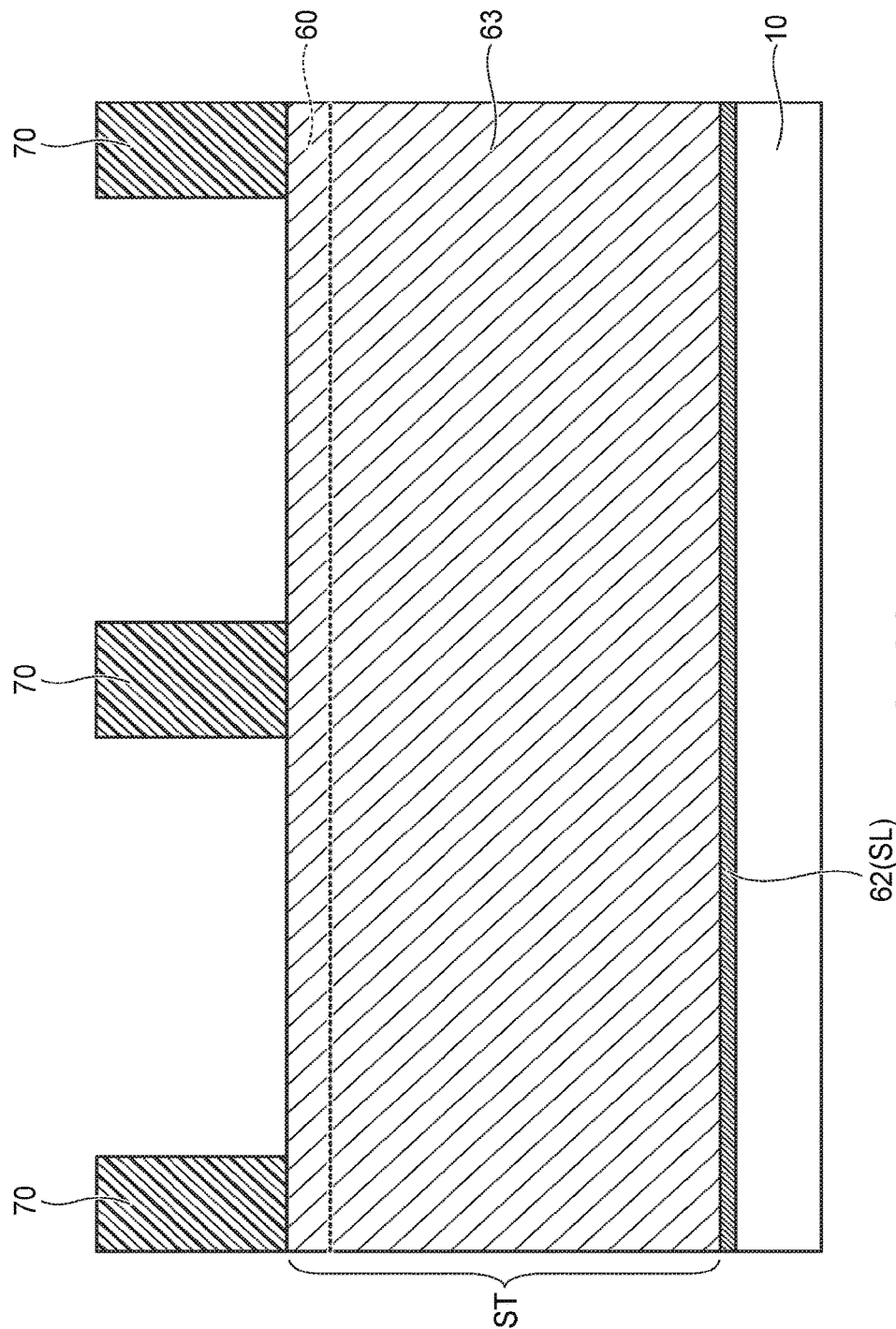

SEMICONDUCTOR MEMORY DEVICE

CROSS-REFERENCE TO RELATED APPLICATION

This application is based upon and claims the benefit of priority from U.S. Provisional Patent Application 62/216,857, filed on Sep. 10, 2015; the entire contents of which are incorporated herein by reference.

FIELD

Embodiments described herein relate generally to a semiconductor memory device.

BACKGROUND

A memory device having a three-dimensional structure has been proposed in which a memory hole is formed in a stacked body in which a plurality of electrode layers are stacked, and a charge storage film and a semiconductor film are provided in the memory hole, extending in a stacking direction of the stacked body. The memory device has a plurality of memory cells connected in series between a drain-side select transistor and a source-side select transistor. The electrode layers in the stacked body are the drain-side select transistor, the source-side select transistor, and gate electrodes of the memory cells. A slit is formed in the stacked body, extending from an upper surface of the stacked body to a substrate. The slit is filled with a conductor. The conductor serves as a source line of a memory string, for example. When the conductor experiences, for example, a reduction in volume, the stacked body may experience peeling, the substrate may warp, and the like. It is desirable to relax stress in the conductor.

BRIEF DESCRIPTION OF THE DRAWINGS

FIG. 19 is a schematic plan view showing a method for manufacturing the semiconductor device of the first embodiment;

FIG. 20A and FIG. 20B are schematic cross-sectional view taken along 20-20 line indicated in FIG. 19;

DETAILED DESCRIPTION

Figure 1:
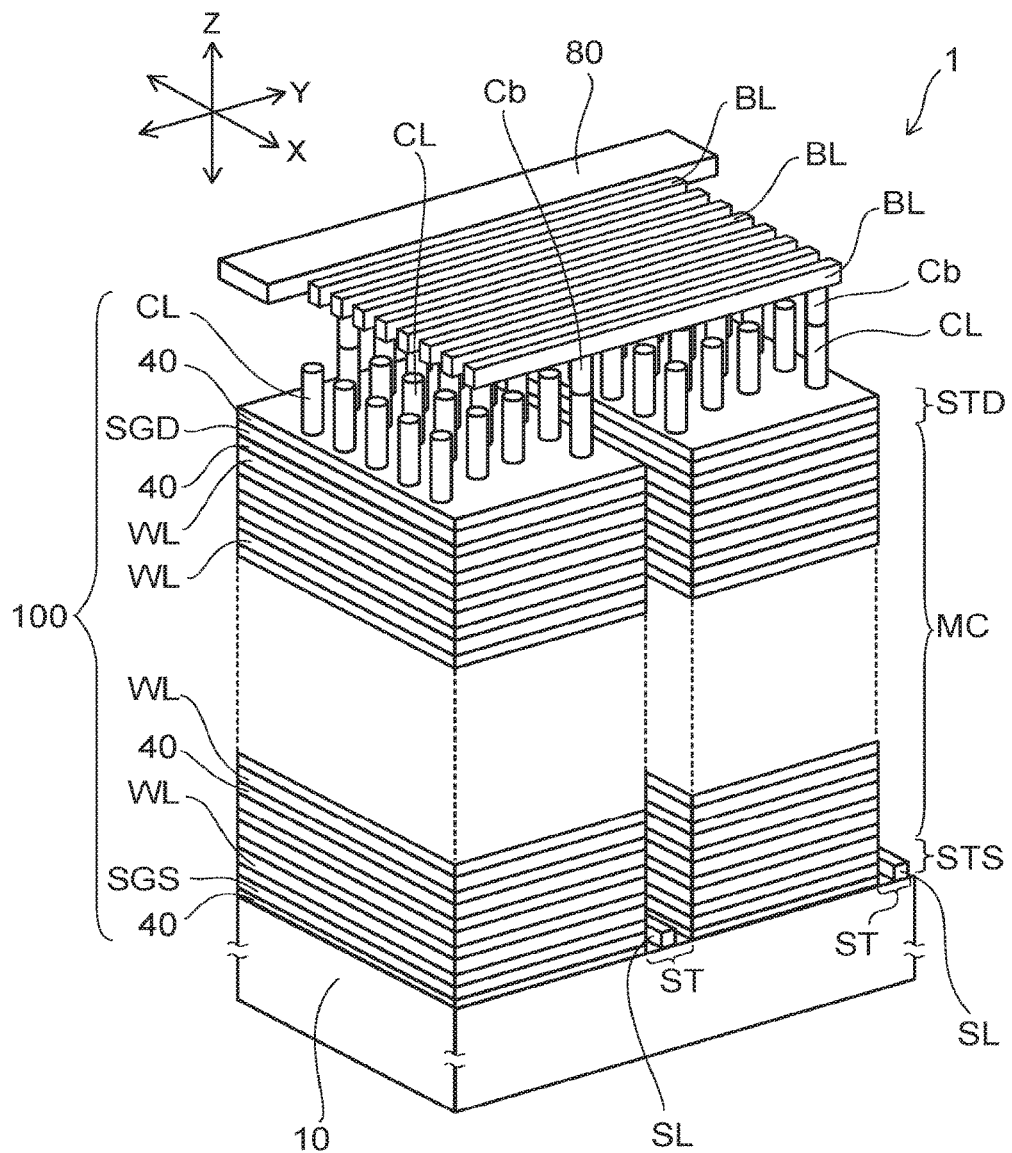
FIG. 1 is a schematic perspective view of a memory cell array of a semiconductor device of a first embodiment.

According to one embodiment, a semiconductor memory device includes a stacked body; a semiconductor body; a charge storage layer; a first conductor; a second conductor; and a third conductor. The stacked body is provided on a major surface of a substrate. The stacked body includes a plurality of electrode layers stacked with an insulator interposed. The semiconductor body is provided in the stacked body. The semiconductor body extends along a stacking direction of the stacked body. The charge storage layer is provided between the semiconductor body and the electrode layers. The first conductor is provided in the stacked body. The first conductor extends along the major surface of the substrate. The first conductor is in contact with the substrate. The second conductor is provided in the stacked body. The second conductor includes a different material from the first conductor. The second conductor is in contact with a first portion of the first conductor. The third conductor is provided in the stacked body. The third conductor includes a same material as the second conductor. The third conductor is in contact with a second portion of the first conductor.

Embodiments will be described below with reference to the drawings. Note that the same reference numerals are applied to the same elements in each drawing. The semiconductor device according to the embodiment is a semiconductor memory device having a memory cell array.

FIG. 1 is a schematic perspective view of a memory cell array 1 of a semiconductor memory device according to a first embodiment. In FIG. 1, two mutually orthogonal directions parallel to a major surface of a substrate 10 are defined as an X-direction (a first direction) and a Y-direction (a second direction), and a direction orthogonal to both the X-direction and the Y-direction is defined as a Z-direction (a third direction, a stacking direction, or a vertical direction). In the specification, "down" refers to a direction toward the substrate 10, whereas "up" refers to a direction away from the substrate 10.

As illustrated in FIG. 1, the memory cell array 1 includes a stacked body 100, a plurality of column portions CL, and a plurality of slits ST. The stacked body 100 includes a drain-side select gate SGD, a plurality of word lines WL, and a source-side select gate SGS.

The source-side select gate (lower gate layer) SGS is provided on the substrate 10. The substrate 10 is, for example, a semiconductor substrate. The semiconductor substrate includes silicon, for example. The plurality of word lines WL are provided on the source-side select gate SGS. The drain-side select gate (upper gate layer) SGD is provided on the plurality of word lines WL. The drain-side select gate SGD, the plurality of word lines WL, and the source-side select gate SGS are electrode layers. Any desired number of electrode layers may be stacked.

The electrode layers (SGD, WL, and SGS) are stacked so as to be separated from each other. Insulators 40 are disposed between the adjacent electrode layers (SGD, WL, and SGS). The insulators 40 may be an insulating material such as a silicon oxide film, or may be air gaps.

A drain-side select transistor STD takes as a gate electrode at least one of the select gates SGD. A source-side select transistor STS takes as a gate electrode at least one of the select gates SGS. A plurality of memory cells MC are connected in series between the drain-side select transistor STD and the source-side select transistor STS. Each of the memory cells MC takes one of the word lines WL as a gate electrode.

The slits ST are provided in the stacked body 100. The slits ST extend in the stacking direction (the Z-direction) and the X-direction in the stacked body 100. The slits ST divide the stacked body 100 into a plurality of regions in the Y-direction. The regions defined by the slits ST are called "blocks".

A source layer SL is disposed in each of the slits ST. The source layers SL are conductors. The source layers SL are insulated from the stacked body 100 and extend in the X-direction, for example. An upper-layer interconnection 80 is disposed above the source layers SL. The upper-layer interconnection 80 extends in the Y-direction. The upper-layer interconnection 80 is electrically connected to a plurality of the source layers SL arranged along the Y-direction.

The column portions CL are provided in the stacked body 100 divided by the slits ST. The column portions CL extend in the stacking direction (the Z-direction). The column portions CL are formed in a cylindrical column shape or elliptic column shape, for example. The column portions CL are disposed in a staggered lattice shape or a square lattice shape, for example, in the memory cell array 1. The drain-side select transistor STD, the plurality of memory cells MC, and the source-side select transistor STS are provided for the column portions CL.

A plurality of bit lines BL are disposed above upper end portions of the column portions CL. The plurality of bit lines BL extend in the Y-direction. The upper end portion of each column portion CL is electrically connected to a single bit line BL through a contact portion Cb. A single bit line is electrically connected to a single selected column portion CL from each block.

Figure 2:
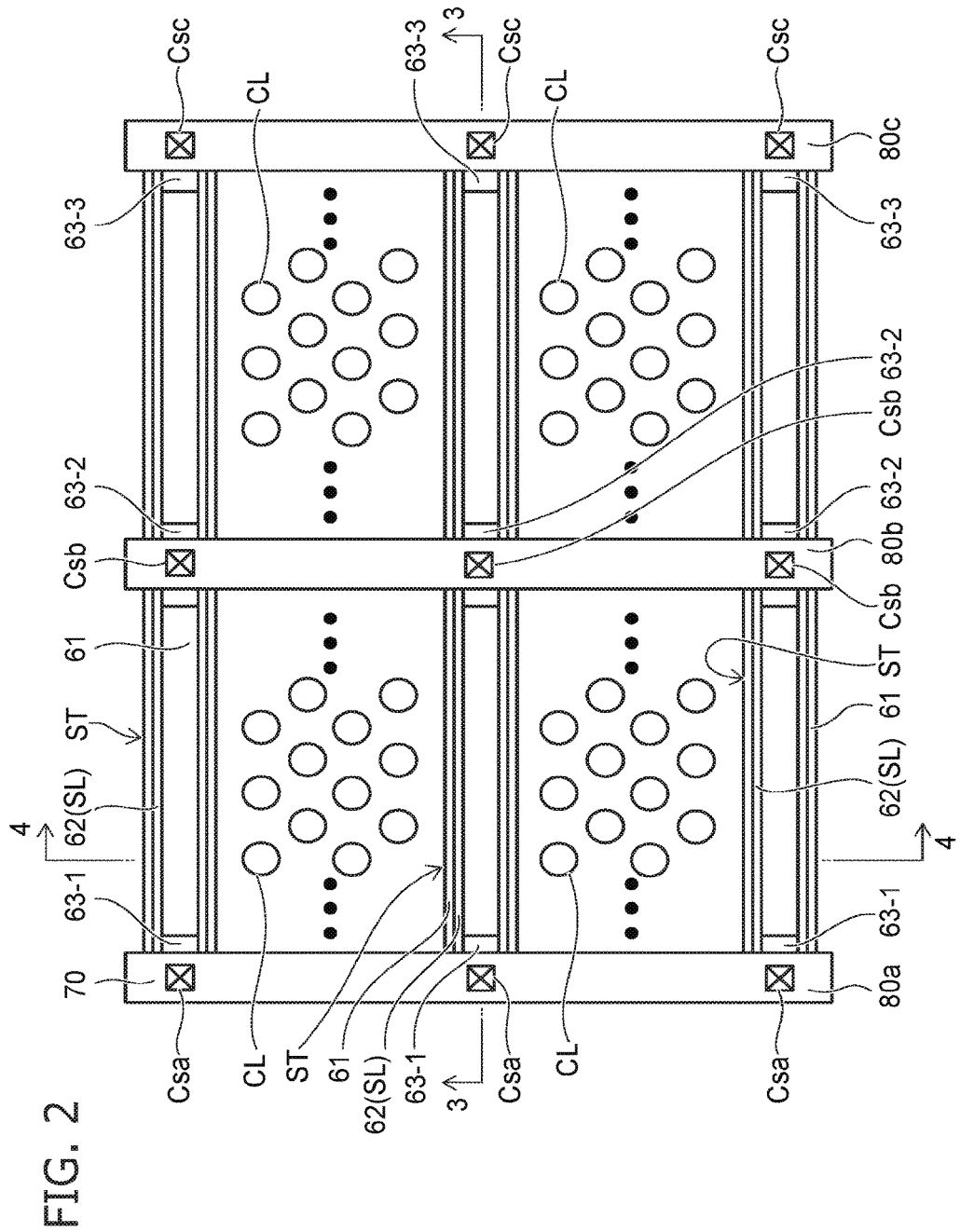
FIG. 2 is a schematic plan view of the memory cell array of the semiconductor device of the first embodiment.
Figure 3:
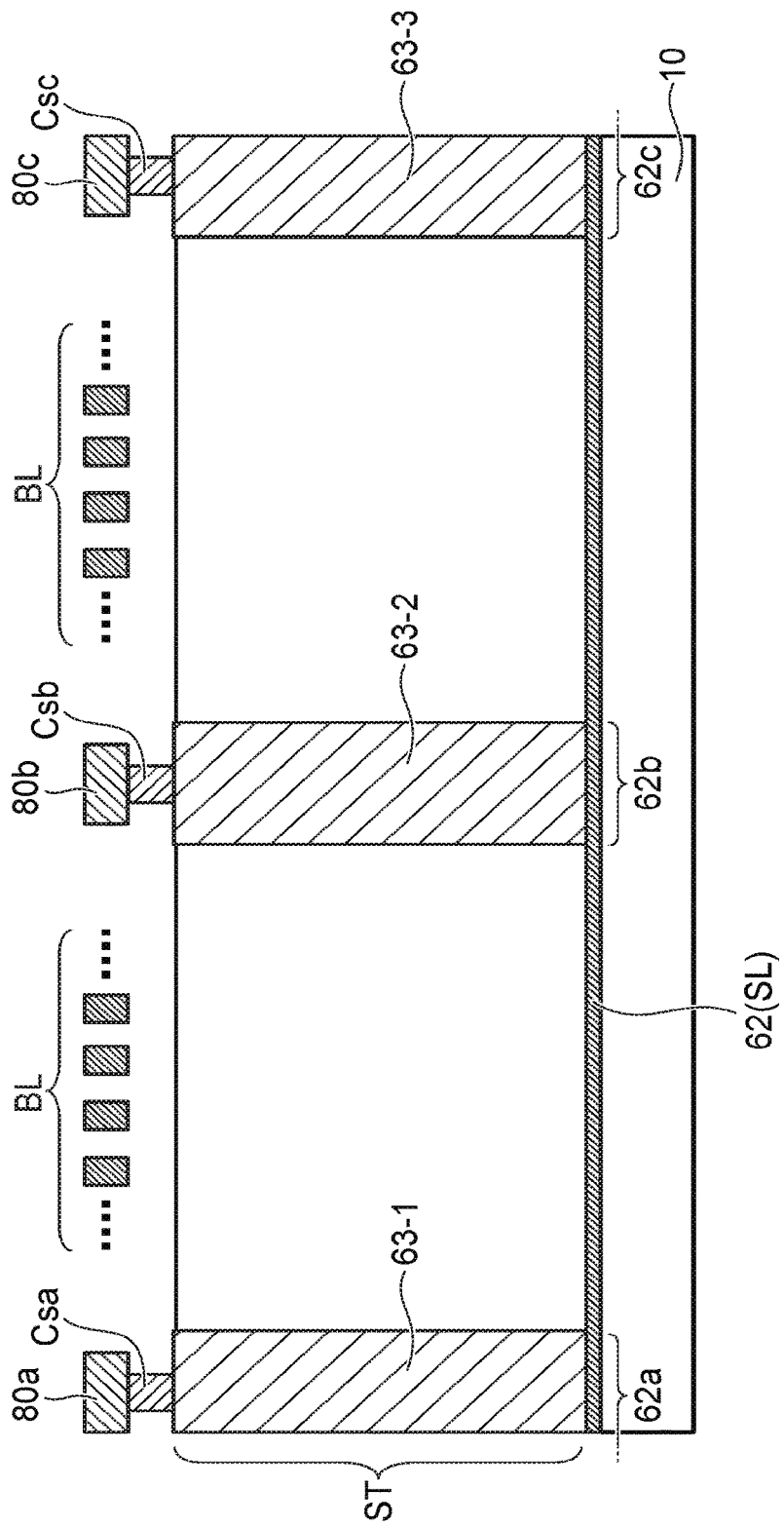
FIG. 3 is a schematic cross-sectional view taken along a 3-3 line indicated in FIG. 2.
Figure 4:
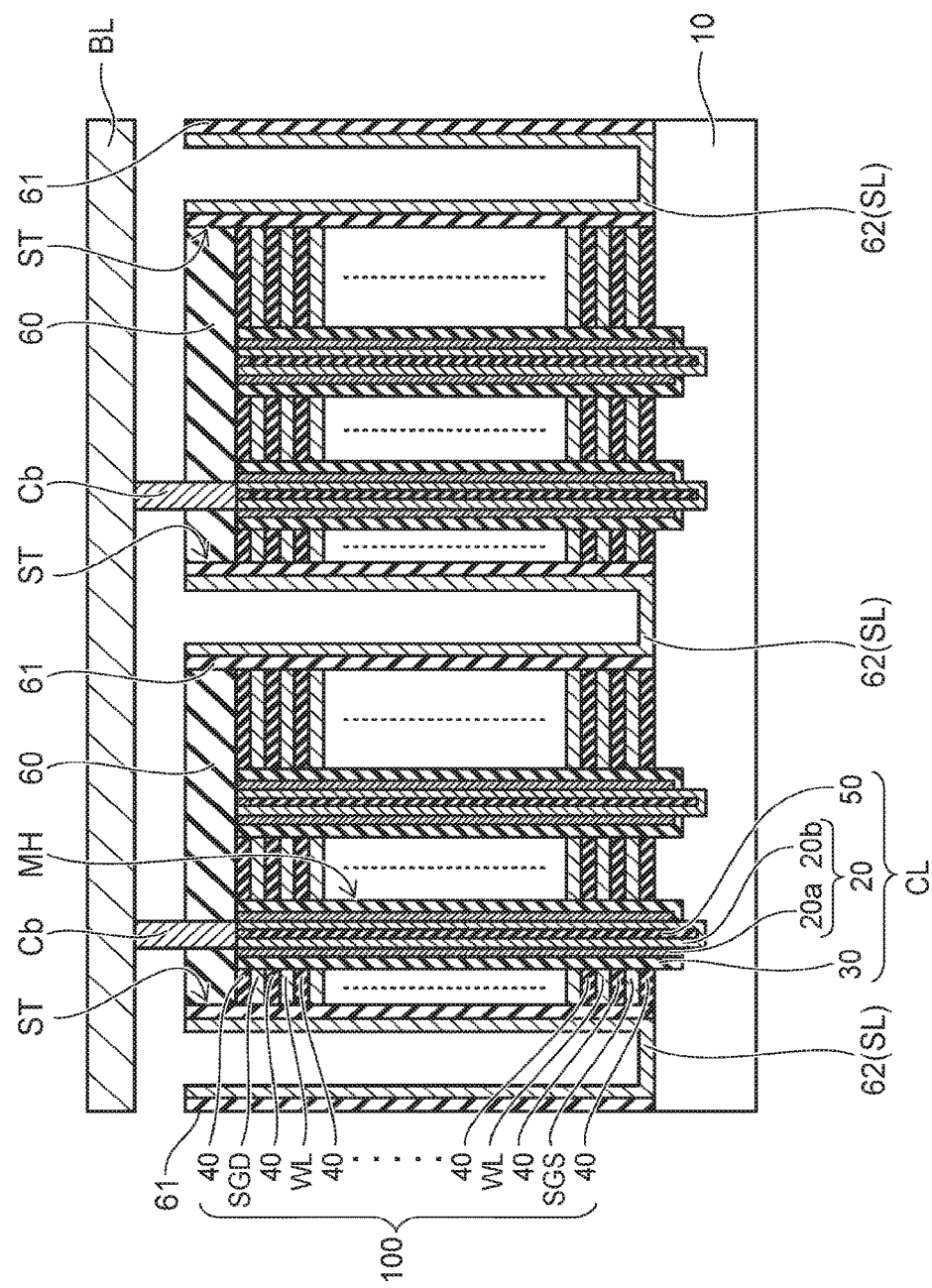
FIG. 4 is a schematic cross-sectional view taken along a 4-4 line indicated in FIG. 2.

FIG. 2 is a schematic plan view of the memory cell array 1 of the semiconductor memory device according to the first embodiment. FIG. 3 is a schematic cross-sectional view taken along a 3-3 line indicated in FIG. 2. FIG. 4 is a schematic cross-sectional view taken along a 4-4 line indicated in FIG. 2. The bit lines BL are not illustrated in FIG. 2.

As illustrated in FIGS. 2 to 4, the column portions CL are provided in memory holes (openings) MH. The memory holes MH are provided in the stacked body 100. The memory holes MH extend in the stacking direction (the Z-direction) of the stacked body 100, in the stacked body 100. Each of the column portions CL includes a memory film 30, a semiconductor body 20, and a core layer 50.

The semiconductor body 20 is provided in the memory hole MH. In the first embodiment, the semiconductor body 20 includes a cover layer 20a and a channel layer 20b. The cover layer 20a is cylindrical, for example. The shape of the channel layer 20b is a closed-bottom cylinder, for example. The cover layer 20a and the channel layer 20b include silicon, for example. The silicon is polysilicon obtained by causing amorphous silicon to crystallize, for example. The conductivity type of the silicon is, for example, a P-type. For example, the semiconductor body 20 is electrically connected to the substrate 10.

The memory film 30 is provided on an inner wall of each of the memory holes MH. The memory film 30 is cylindrical, for example. The memory film 30 includes a cover insulating film, a charge storage layer, and a tunnel insulating film. The cover insulating film, the charge storage layer, and the tunnel insulating film are not illustrated.

The charge storage layer is provided between the semiconductor body 20 and the electrode layers (SGD, WL, and SGS). The charge storage layer includes silicon nitride, for example. The silicon nitride may be hafnium oxide. The charge storage layer has a trap site that traps a charge in the layer. A charge is trapped in the trap site. A threshold of the memory cell MC changes depending on the presence or absence of a trapped charge in the charge storage layer, or on the amount of the trapped charge. This allows the memory cells MC to hold information.

The cover insulating film is provided between the charge storage layer and the electrode layers (SGD, WL, and SGS). For example, the cover insulating film is provided on the inner wall of the memory hole MH. The cover insulating film includes silicon oxide, or silicon oxide and aluminum oxide, for example. The cover insulating film protects the charge storage layer from etching, for example, when the word lines WL are formed.

The tunnel insulating film is provided between the charge storage film and the semiconductor body 20. The tunnel insulating film includes silicon oxide, or silicon oxide and silicon nitride, for example. The tunnel insulating film is a potential barrier between the charge storage film and the semiconductor body 20. A charge tunnels through the tunnel insulating film when a charge is injected from the semiconductor body 20 into the charge storage layer (a write operation) and when a charge is dispersed from the charge storage layer to the semiconductor body 20 (an erase operation).

The core layer 50 is provided upon the semiconductor body 20. The core layer 50 has insulating properties. The core layer 50 includes silicon oxide, for example. The core layer 50 has a column shape, for example.

The memory hole MH is filled with the memory film 30, the semiconductor body 20, and the core layer 50.

The electrode layers (SGD, WL, and SGS) are provided upon the memory film 30. The electrode layers (SGD, WL, and SGS) include tungsten, for example. The electrode layers (SGD, WL, and SGS) surround the column portions CL.

A first insulating film 60 is provided on the upper surface of the stacked body 100. The first insulating film 60 includes silicon oxide, for example.

The slit ST extends along the stacking direction of the stacked body 100 (the Z-direction) and the major surface of the substrate 10 (the X-direction, in the first embodiment) in the stacked body 100. The slit ST extends to the substrate 10. A second insulating film 61 is provided on the side surface of the slit ST. The second insulating film 61 includes silicon oxide, for example. A first conductor 62 is provided upon the bottom surface of the slit ST and upon the second insulating film 61. The first conductor 62 includes titanium, or titanium and titanium nitride, for example. The first conductor 62 is in contact with the substrate 10. This causes the first conductor 62 to be electrically connected to the substrate 10. The first conductor 62 serves as the source layer SL in the first embodiment. Although the first conductor 62 is provided upon the second insulating film 61 and upon the bottom surface of the slit ST (the substrate 10, for example) in the first embodiment, it is sufficient for the first conductor 62 to be provided at least upon the bottom surface of the slit ST.

A plurality of conductors 63 are provided in the slit ST. For example, a second conductor 63-1, a third conductor 63-2, and a fourth conductor 63-3 are illustrated in FIGS. 2 and 3. The second conductor 63-1 to the fourth conductor 63-3 include a different material from the first conductor 62. In the first embodiment, the second conductor 63-1 to the fourth conductor 63-3 include tungsten, for example. The second conductor 63-1 is in contact with a first portion 62a of the first conductor 62. The third conductor 63-2 is in contact with a second portion 62b of the first conductor 62. The fourth conductor 63-3 is in contact with a third portion 62c of the first conductor 62. This causes the second conductor 63-1 to the fourth conductor 63-3 to be electrically connected to the first conductor 62.

The upper-layer interconnection 80 is provided above the stacked body 100. A first upper-layer interconnection 80a, a second upper-layer interconnection 80b, and a third upper-layer interconnection 80c are illustrated in FIGS. 2 and 3. The first upper-layer interconnection 80a is electrically connected to the second conductor 63-1 via a contact portion Csa, for example. The second upper-layer interconnection 80b is electrically connected to the third conductor 63-2 via a contact portion Csb, for example. The third upper-layer interconnection 80c is electrically connected to the fourth conductor 63-3 via a contact portion Csc, for example. As illustrated in FIG. 2, the first upper-layer interconnection 80a is electrically connected to a plurality of the second conductors 63-1 arranged in the Y-direction. Likewise, the second upper-layer interconnection 80b is electrically connected to a plurality of the third conductors 63-2 arranged in the Y-direction. The third upper-layer interconnection 80c is electrically connected to a plurality of the fourth conductors 63-3 arranged in the Y-direction. In other words, each conductors 63-1, 63-2, and 63-3 are provided below the upper-layer interconnections 80a, 80b, and 80c, respectively; the upper-layer interconnections 80a, 80b, and 80c are connected with the each conductors 63-1, 63-2, and 63-3, respectively; and the each conductors 63-1, 63-2, and 63-3 are separated by gaps.

According to the first embodiment, the conductors 63 are separated into a plurality of conductors and provided in the slit ST. Accordingly, stress exerted on the stacked body 100, the substrate 10, and the like by the conductors 63 can be relaxed as compared to a case where the slit ST is filled with the conductors 63. As such, the first embodiment can suppress, for example, the stacked body 100 from peeling and the substrate 10 from warping.

Figure 5:
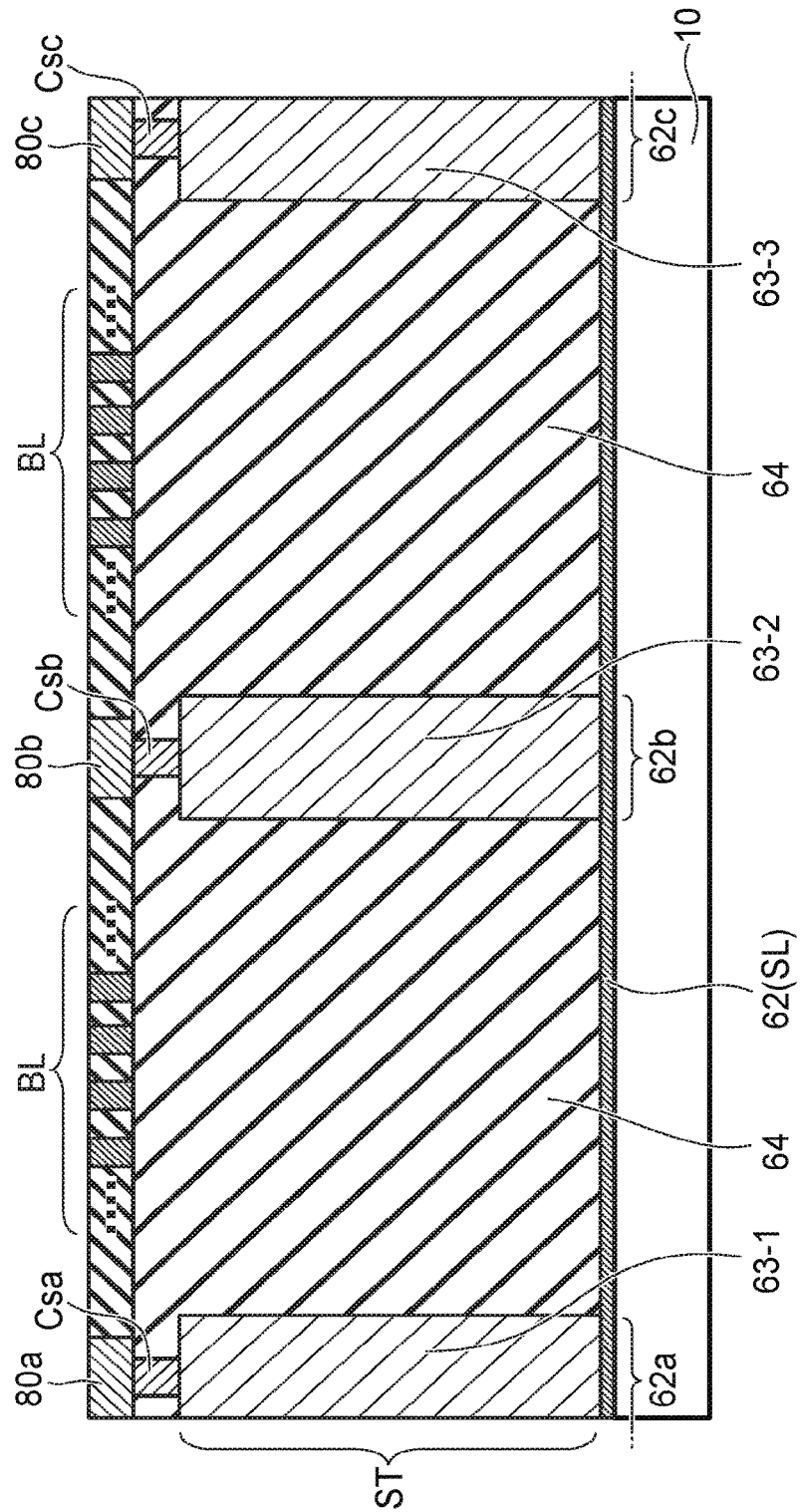
FIG. 5 is schematic cross-sectional view of the semiconductor device of a first variation of the first embodiment.
Figure 6:
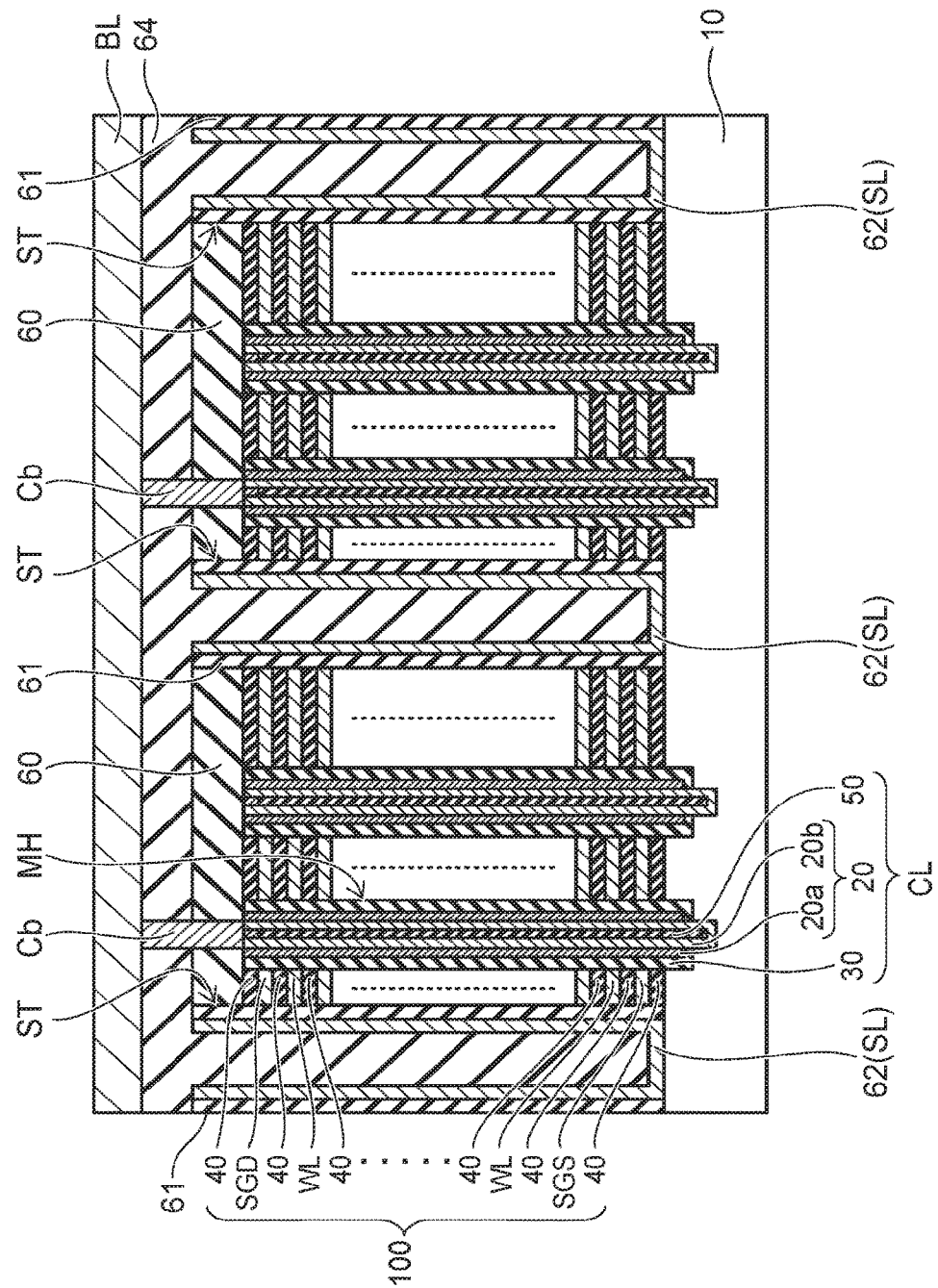
FIG. 6 is schematic cross-sectional view of the semiconductor device of the first variation of the first embodiment.

FIGS. 5 and 6 are schematic cross-sectional views of the semiconductor device according to a first variation on the first embodiment. The cross section illustrated in FIG. 5 corresponds to the cross section illustrated in FIG. 3. The cross section illustrated in FIG. 6 corresponds to the cross section illustrated in FIG. 4. FIGS. 5 and 6 illustrate the first variation, in which a space produced between the conductors 63 is processed.

As illustrated in FIGS. 5 and 6, a structure 64, for example, can be provided between the second conductor 63-1 and the third conductor 63-2 and between the third conductor 63-2 and the fourth conductor 63-3. The structure 64 includes a different material from the second to fourth conductors 63-1 to 63-3. It is preferable for the material of the structure 64 to be a material having a lower volume contraction rate than the second to fourth conductors 63-1 to 63-3, for example. For example, a material having a volume contraction rate close to the volume contraction rate of the stacked body 100 or a material having a volume contraction rate close to the volume contraction rate of the substrate 10 is preferable as the material of the structure 64. The stacked body 100 includes silicon oxide, for example. The substrate 10 includes silicon. Accordingly, it is preferable for a material including silicon, for example, to be selected as the material of the structure 64.

According to the first variation on the first embodiment, silicon oxide, for example, is selected as the material including silicon for the structure 64. As a result, according to the first embodiment, the stress exerted on the stacked body 100, the substrate 10, or the like can be relaxed as compared to a case where the slit ST is filled with tungsten, for example.

Meanwhile, taking the structure 64 according to the first variation on the first embodiment as an insulator allows the structure 64 to be used as an insulator insulating the contact portions Cb, and Csa to Csc, for example.

Figure 7:
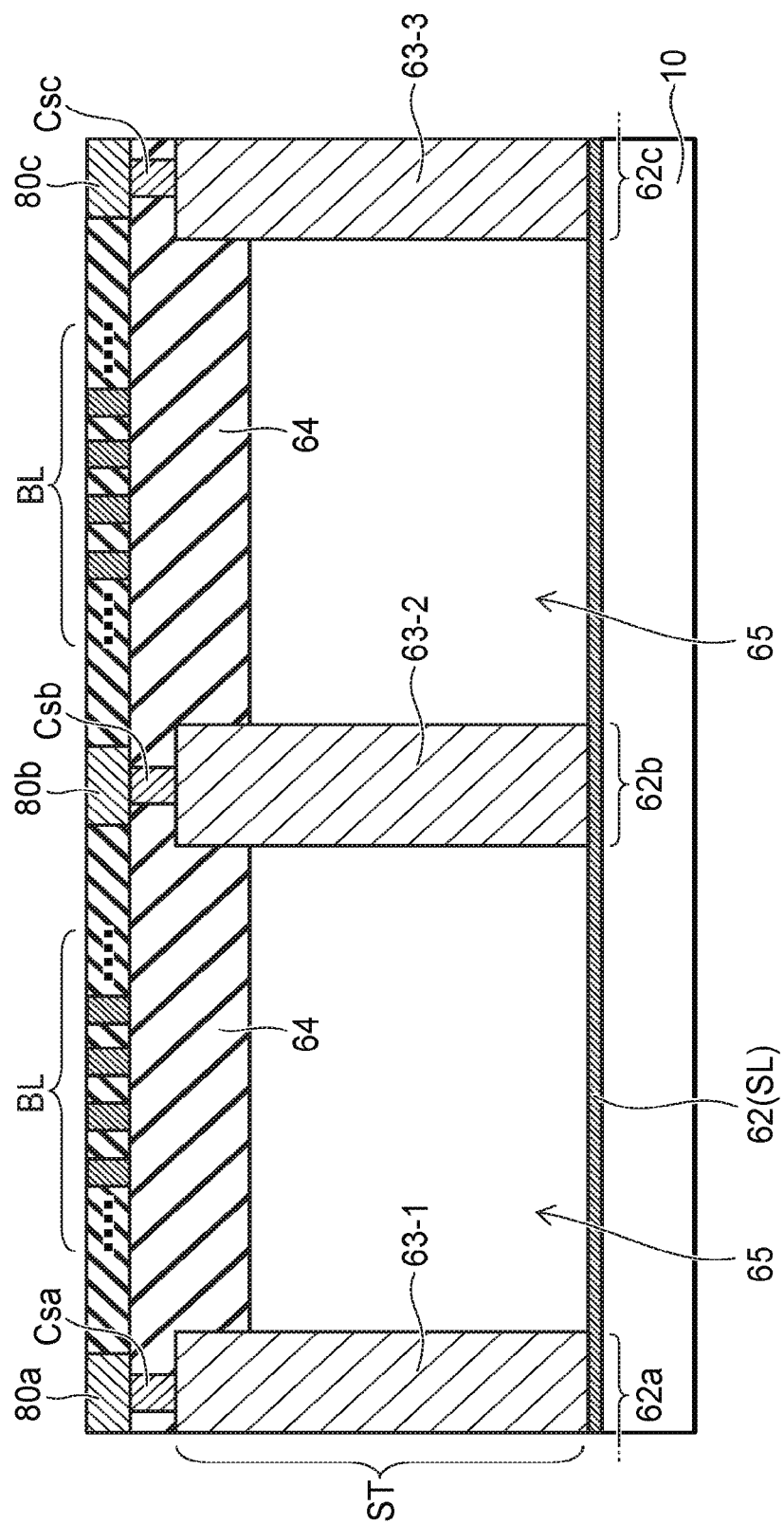
FIG. 7 is schematic cross-sectional view of the semiconductor device of a second variation of the first embodiment.
Figure 8:
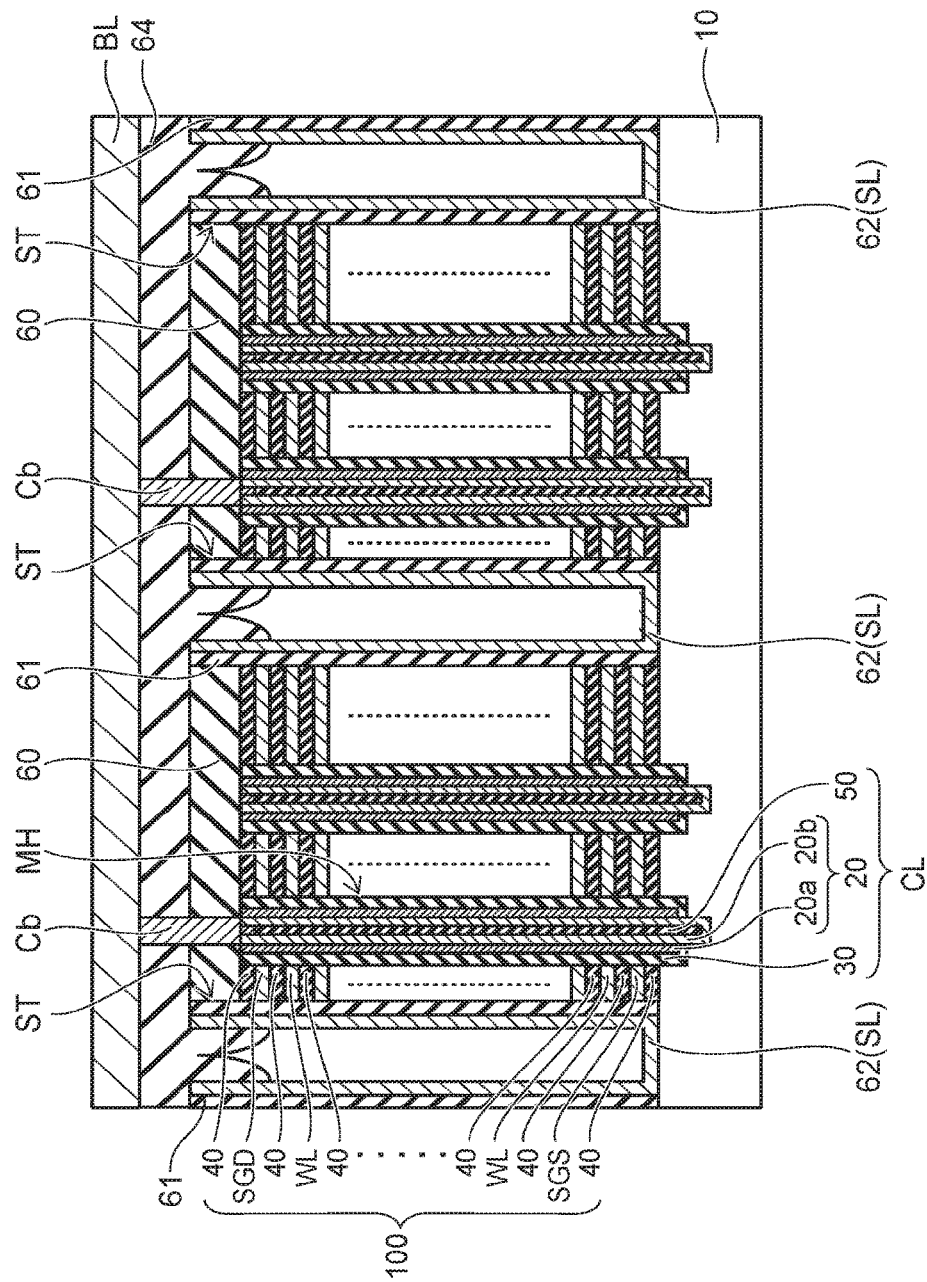
FIG. 8 is schematic cross-sectional view of the semiconductor device of the second variation of the first embodiment.

FIGS. 7 and 8 are schematic cross-sectional views of the semiconductor device according to a second variation on the first embodiment. The cross section illustrated in FIG. 7 corresponds to the cross section illustrated in FIG. 3. The cross section illustrated in FIG. 8 corresponds to the cross section illustrated in FIG. 4. FIGS. 7 and 8 illustrate a second variation, in which a space produced between conductors 63 is processed.

As illustrated in FIGS. 7 and 8, a space between the second conductor 63-1 and the third conductor 63-2 and a space between the third conductor 63-2 and the fourth conductor 63-3 need not be completely filled with the structure 64. An air gap 65 may be included between the second conductor 63-1 and the third conductor 63-2 and between the third conductor 63-2 and the fourth conductor 63-3.

Figure 9:
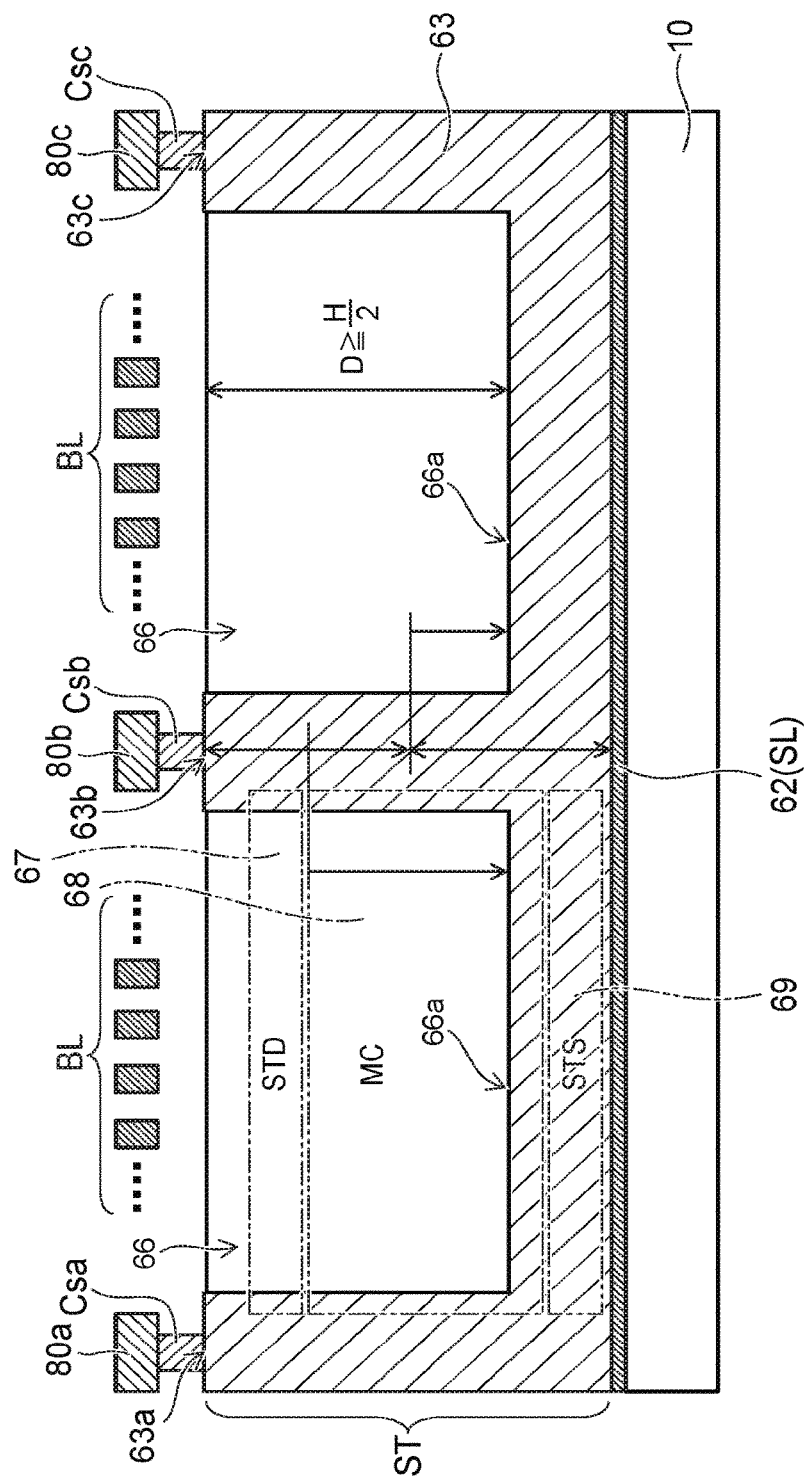
FIG. 9 is schematic cross-sectional view of a semiconductor device of a second embodiment.
Figure 10:
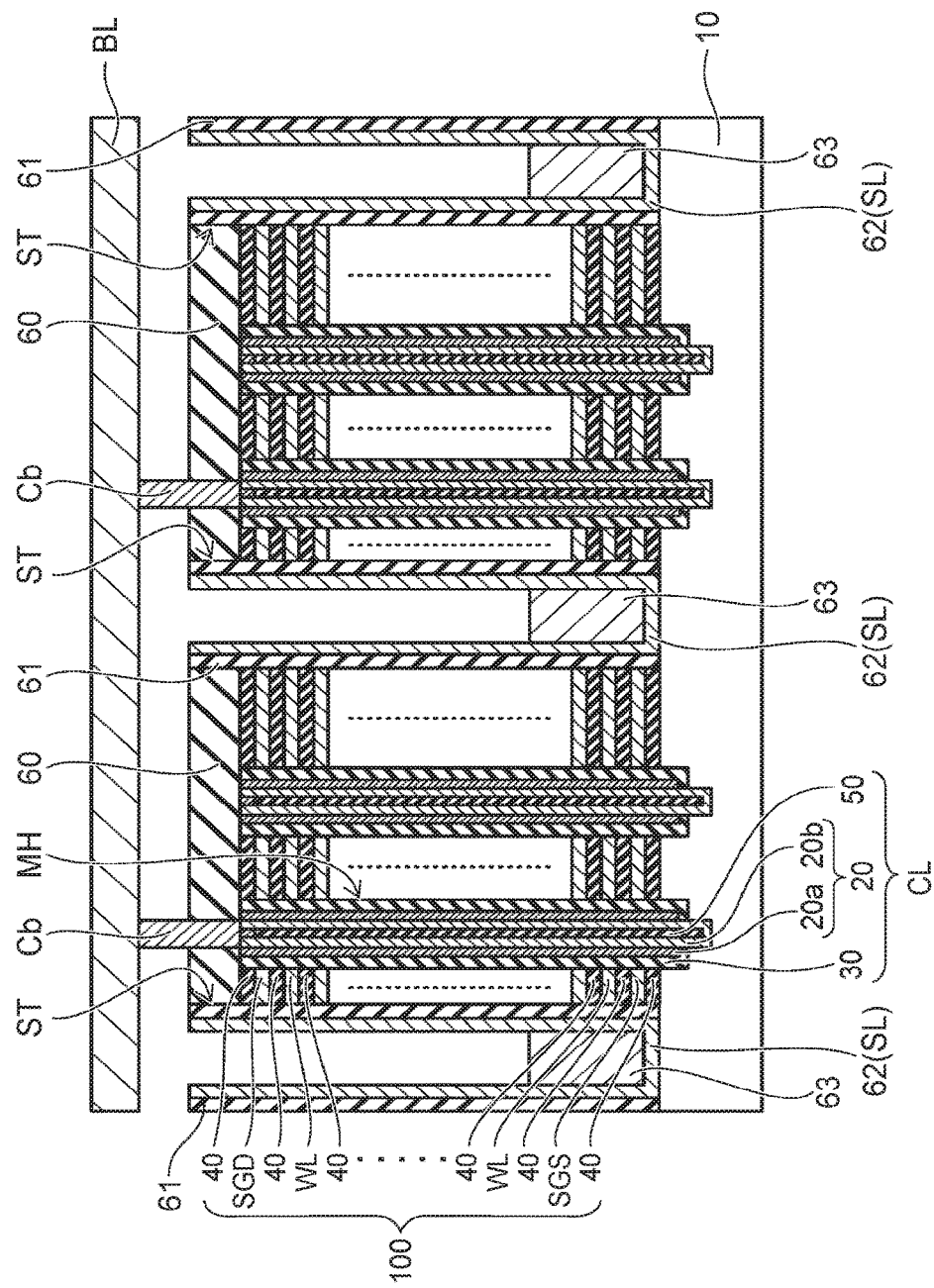
FIG. 10 is schematic cross-sectional view of a semiconductor device of the second embodiment.

FIGS. 9 and 10 are schematic cross-sectional views of a semiconductor device according to a second embodiment. The cross section illustrated in FIG. 9 corresponds to the cross section illustrated in FIG. 3. The cross section illustrated in FIG. 10 corresponds to the cross section illustrated in FIG. 4.

As illustrated in FIGS. 9 and 10, the second embodiment differs from the first embodiment in that the conductors 63 are connected in the slit ST. The semiconductor device according to the second embodiment includes at least one recess portion 66 in the upper surface of each conductor 63.

The conductor 63 includes a first contact portion 63a, a second contact portion 63b, and a third contact portion 63c on the upper surface of the conductor 63. The first upper-layer interconnection 80a is in contact with the first contact portion 63a of the conductor 63 through the contact portion Csa. The second upper-layer interconnection 80b is in contact with the second contact portion 63b of the conductor 63 through the contact portion Csb. The third upper-layer interconnection 80c is in contact with the third contact portion 63c of the conductor 63 through the contact portion Csc. Accordingly, the conductor 63 is electrically connected to the upper-layer interconnections 80a to 80c. A lower surface of the conductor 63 is in contact with the first conductor 62. This causes the conductor 63 to be electrically connected to the first conductor 62.

The recess portion 66 is provided between the first contact portion 63a and the second contact portion 63b and between the second contact portion 63b and the third contact portion 63c.

Like the first embodiment, the structure 64 can be provided in the recess portion 66. Also like the first embodiment, the air gap 65 can be provided in the recess portion 66.

The semiconductor body 20 includes a first portion 67, a second portion 68, and a third portion 69 along the stacking direction (the Z-direction). The second portion 68 is provided between the first portion 67 and the third portion 69. The first portion 67 includes a channel for the drain-side select transistor (an upper-side select transistor) STD. The second portion 68 includes a channel for the memory cells MC. The third portion 69 includes a channel for the source-side select transistor (a lower-side select transistor) STS.

A bottom surface 66a of the recess portion 66 is lower than the first portion 67, for example. In the second embodiment, the bottom surface 66a of the recess portion 66 is in the second portion 68. It is preferable for the bottom surface 66a of the recess portion 66 to be lower in order to relax stress produced by the conductor 63. A position of the bottom surface 66a may be not more than ½ a height "H" of the conductor 63, for example. A depth "D" of the recess portion 66 may be not less than H/2 (D≥H/2), for example. The bottom surface 66a may be in the third portion 69.

The amount of the conductor 63 in the slit ST is reduced according to this second embodiment as well. Accordingly, stress exerted on the stacked body 100, the substrate 10, and the like can be relaxed.

Figure 11:
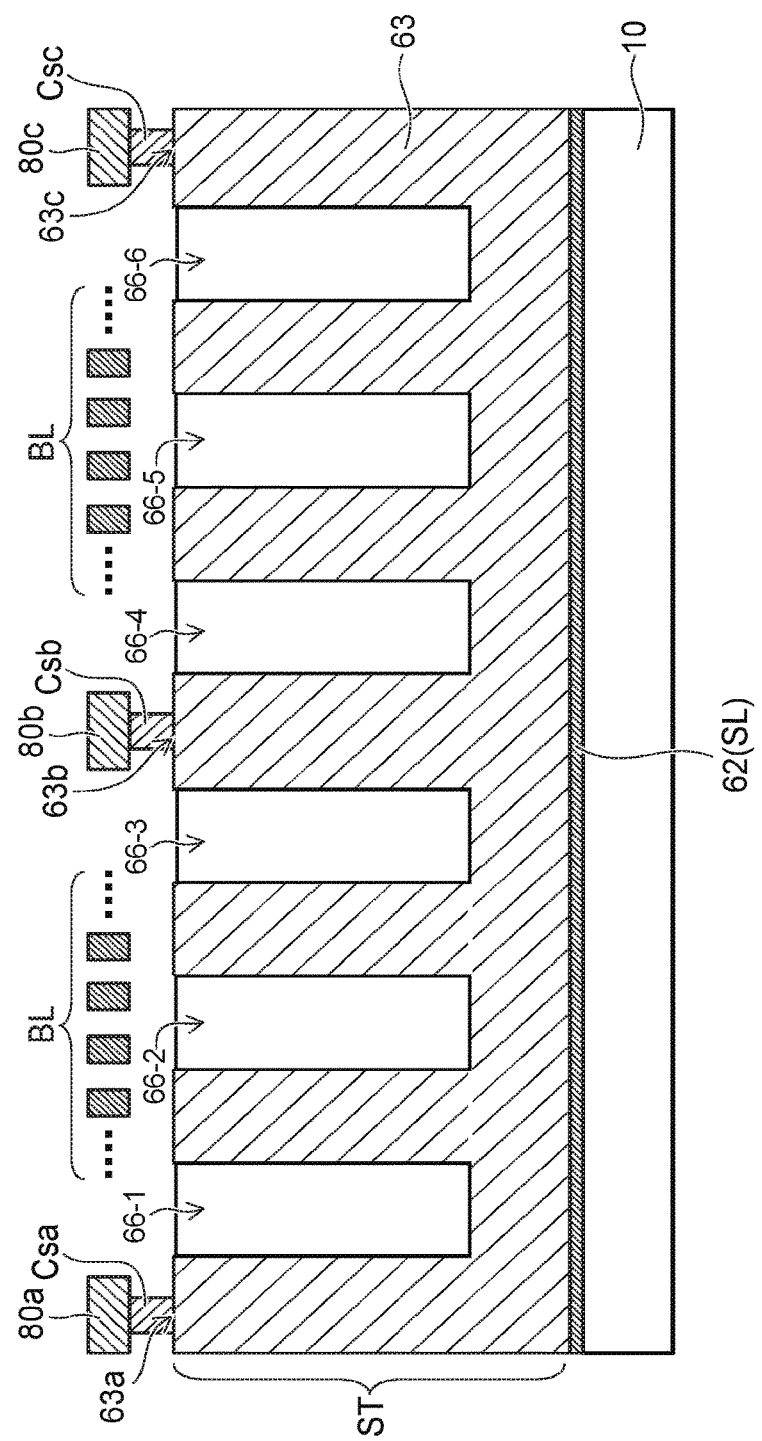
FIG. 11 is schematic cross-sectional view of the semiconductor device of a first variation of the second embodiment.

FIG. 11 is a schematic cross-sectional view of a semiconductor device according to a first variation on the second embodiment. The cross section illustrated in FIG. 11 corresponds to the cross section illustrated in FIG. 9.

The first variation on the second embodiment differs from the second embodiment in that recess portions 66-1 to 66-3 are included between the first contact portion 63a and the second contact portion 63b. In the first variation, recess portions 66-4 to 66-6 are also included between the second contact portion 63b and the third contact portion 63c.

Two or more of the recess portions 66 (66-1 to 66-3 and 66-4 to 66-6) may be provided between the first contact portion 63a and the second contact portion 63b and between the second contact portion 63b and the third contact portion 63c.

It is also possible to provide the structure 64, the air gap 65, or the like in the recess portions 66-1 to 66-6.

Figure 12:
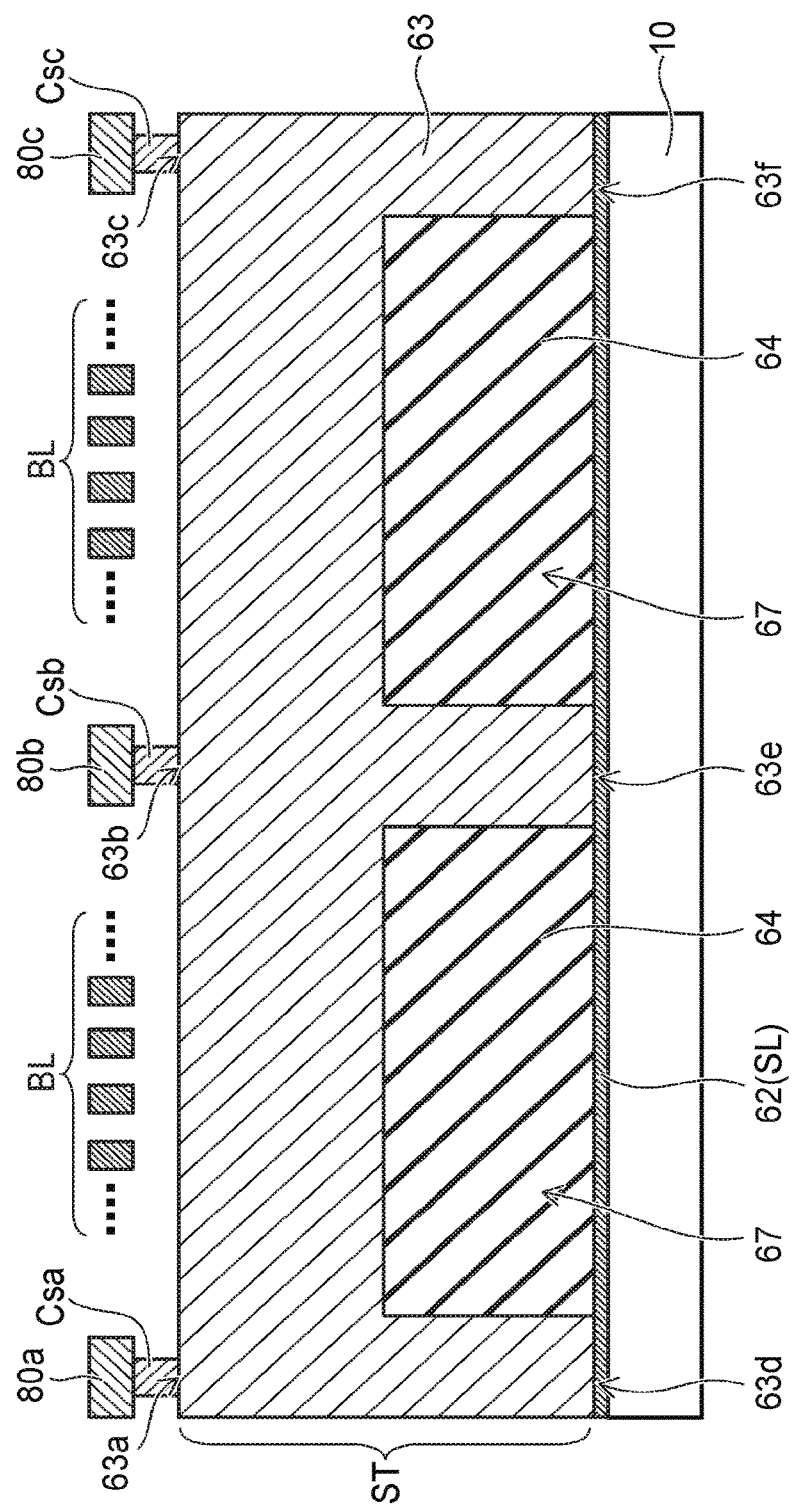
FIG. 12 is schematic cross-sectional view of a semiconductor device of a third embodiment.

FIG. 12 is a schematic cross-sectional view of a semiconductor device according to a third embodiment. The cross section illustrated in FIG. 12 corresponds to the cross section illustrated in FIG. 3.

As illustrated in FIG. 12, the third embodiment differs from the first embodiment in that the conductors 63 are connected in the slit ST. The semiconductor device according to the third embodiment includes at least one recess portion 67 in a lower surface of each conductor 63.

In the third embodiment, the conductor 63 includes a fourth contact portion 63d, a fifth contact portion 63e, and a sixth contact portion 63f in the lower surface of the conductor 63. The fourth contact portion 63d to the sixth contact portion 63f are provided in the lower surface of the conductor 63. The fourth contact portion 63d to the sixth contact portion 63f are in contact with the first conductor 62. Thus, the conductor 63 is electrically connected to the first conductor 62.

The recess portion 67 is provided between the fourth contact portion 63d and the fifth contact portion 63e and between the fifth contact portion 63e and the sixth contact portion 63f.

Like the first embodiment, the structure 64 can be provided in the recess portion 67 (see FIG. 12).

The amount of the conductor 63 in the slit ST is reduced according to this third embodiment as well. This allows the stress exerted on the stacked body 100, the substrate 10, and the like to be relaxed.

Figure 13:
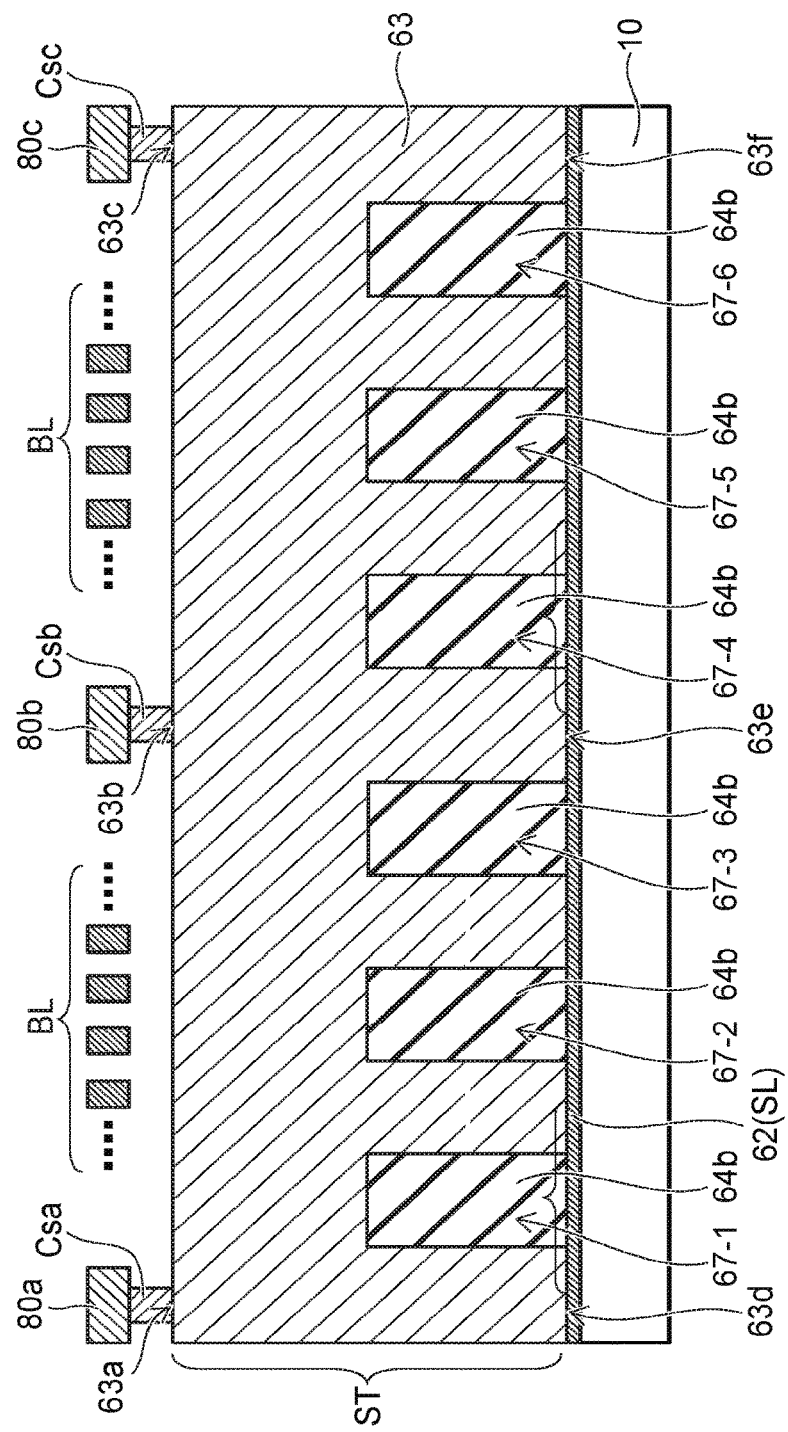
FIG. 13 is schematic cross-sectional view of the semiconductor device of a first variation of the third embodiment.

FIG. 13 is a schematic cross-sectional view of a semiconductor device according to a first variation on the third embodiment. The cross section illustrated in FIG. 13 corresponds to the cross section illustrated in FIG. 12.

The first variation on the third embodiment differs from the third embodiment in that recess portions 67-1 to 67-3 are included between the fourth contact portion 63d and the fifth contact portion 63e and recess portions 67-4 to 67-6 are included between the fifth contact portion 63e and the sixth contact portion 63f.

In this manner, two or more recess portions 67-1 to 67-3 may be provided between the fourth contact portion 63d and the fifth contact portion 63e. Likewise, two or more recess portions 67-4 to 67-6 may be provided between the fifth contact portion 63e and the sixth contact portion 63f.

Like the first embodiment, the structure 64 can be provided in the recess portions 67-1 to 67-6 (see FIG. 13).

Figure 14:
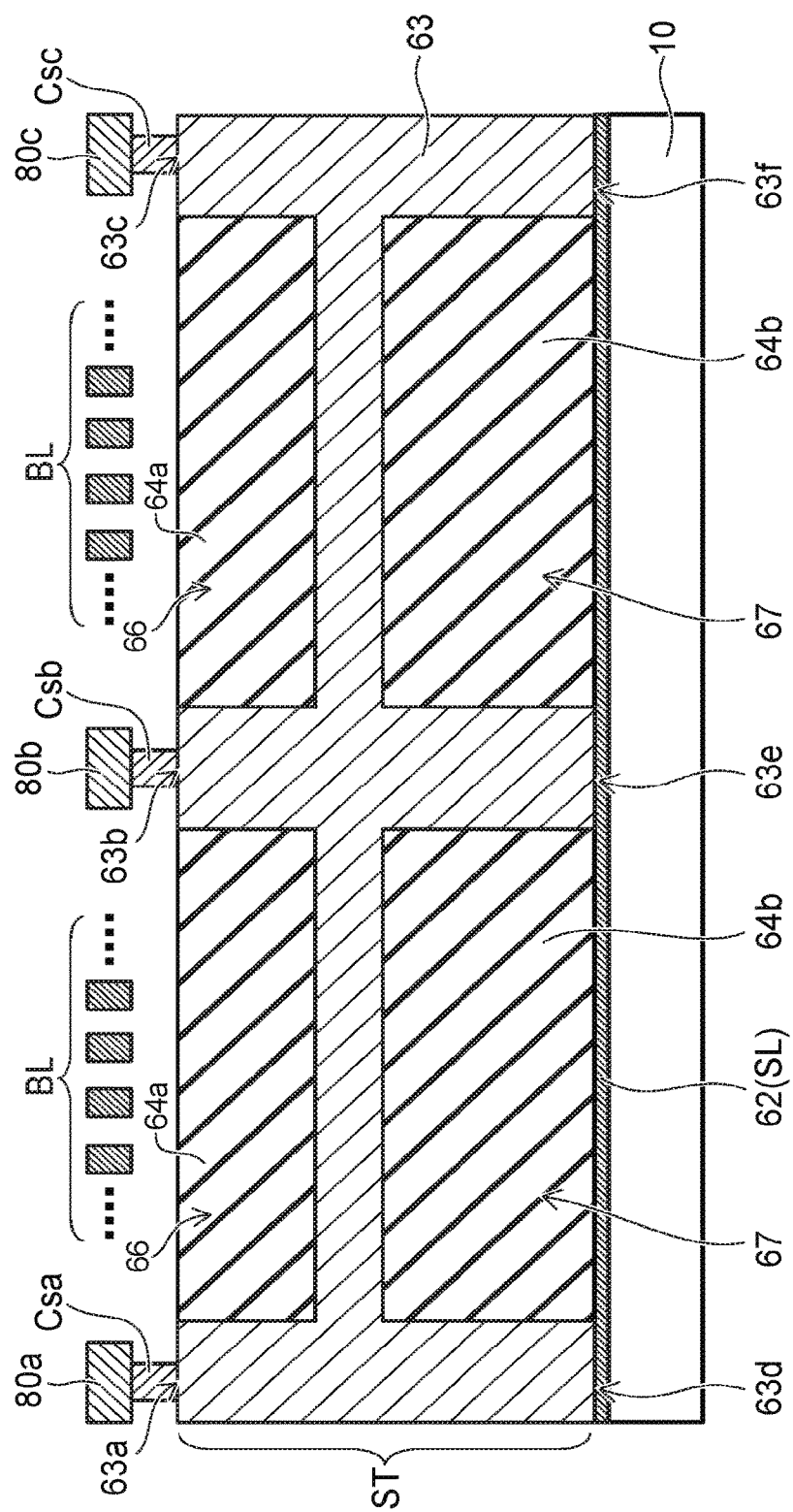
FIG. 14 is schematic cross-sectional view of the semiconductor device of a second variation of the third embodiment.

FIG. 14 is a schematic cross-sectional view of a semiconductor device according to a second variation on the third embodiment. The cross section illustrated in FIG. 14 corresponds to the cross section illustrated in FIG. 12.

As illustrated in FIG. 14, the second variation on the third embodiment is a combination of the second embodiment and the third embodiment. In the second variation, the semiconductor device illustrated in FIGS. 9 and 10 is combined with the semiconductor device illustrated in FIG. 12. In the second variation, a recess portion (an upper-side recess portion) 66 is included in the upper surface of the conductor 63 and a recess portion (a lower-side recess portion) 67 is included in the lower surface of the conductor 63.

The upper-side recess portion 66 is provided between the first contact portion 63a and the second contact portion 63b and between the second contact portion 63b and the third contact portion 63c. The lower-side recess portion 67 is provided between the fourth contact portion 63d and the fifth contact portion 63e and between the fifth contact portion 63e and the sixth contact portion 63f.

Like the first embodiment, the structure 64 can be provided in the upper-side recess portion 66 and the lower-side recess portion 67. FIG. 14 illustrates a case where a structure 64a is provided in the upper-side recess portion 66 and a structure 64b is provided in the lower-side recess portion 67. Also like the first embodiment, the air gap 65 can be provided in the upper-side recess portion 66.

In this manner, the third embodiment can be combined with the second embodiment.

Figure 15:
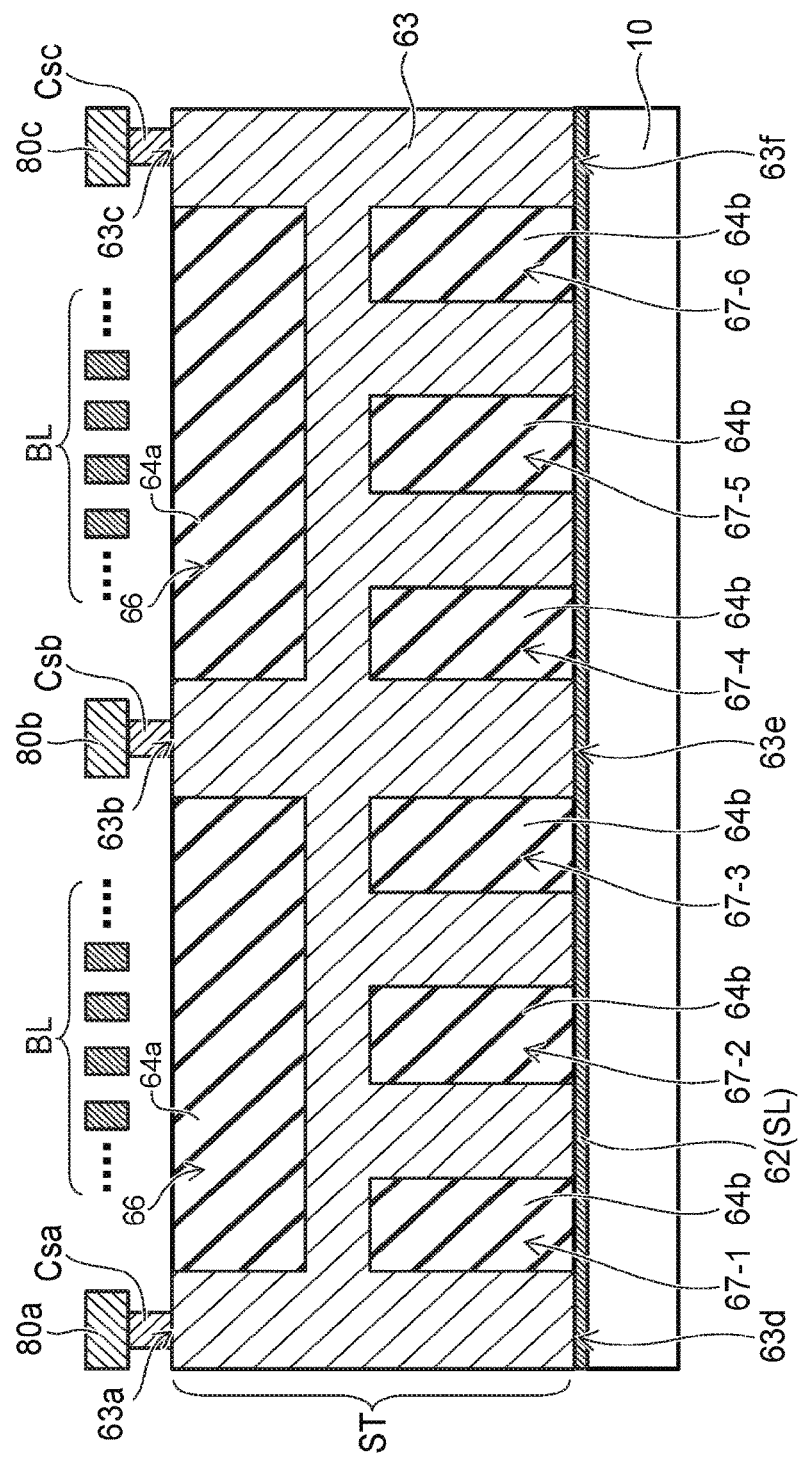
FIG. 15 is schematic cross-sectional view of the semiconductor device of a third variation of the third embodiment.

FIG. 15 is a schematic cross-sectional view of a semiconductor device according to a third variation on the third embodiment. The cross section illustrated in FIG. 15 corresponds to the cross section illustrated in FIG. 12.

As illustrated in FIG. 15, the third variation on the third embodiment is a combination of the second embodiment and the first variation on the third embodiment. In the third variation, the semiconductor device illustrated in FIGS. 9 and 10 is combined with the semiconductor device illustrated in FIG. 13.

In this manner, according to the embodiment, the second embodiment and the first variation on the third embodiment can be combined.

Figure 16:
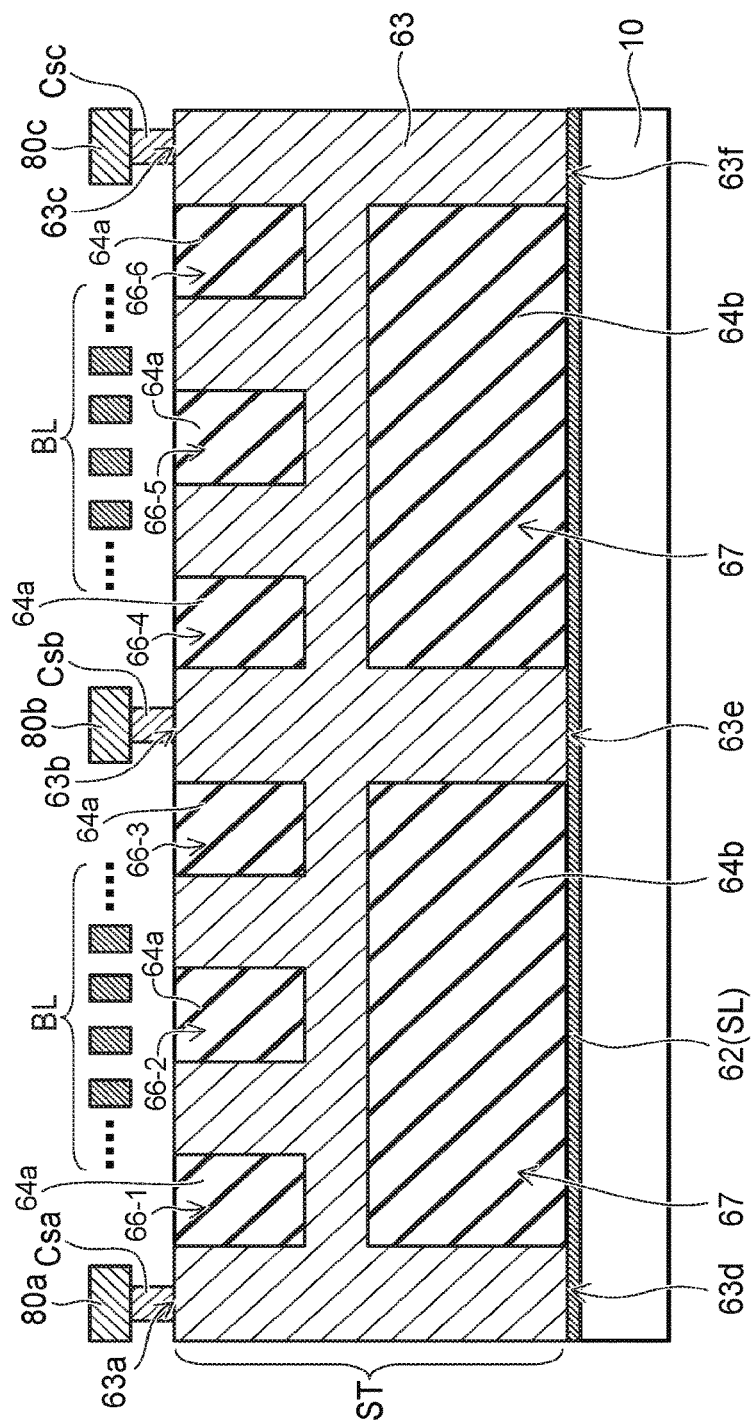
FIG. 16 is schematic cross-sectional view of the semiconductor device of a fourth variation of the third embodiment.

FIG. 16 is a schematic cross-sectional view of a semiconductor device according to a fourth variation on the third embodiment. The cross section illustrated in FIG. 16 corresponds to the cross section illustrated in FIG. 12.

As illustrated in FIG. 16, the fourth variation on the third embodiment is a combination of the first variation on the second embodiment and the third embodiment. In the fourth variation, the semiconductor device illustrated in FIG. 11 is combined with the semiconductor device illustrated in FIG. 12.

In this manner, according to the embodiment, the first variation on the second embodiment and the third embodiment can be combined.

Figure 17:
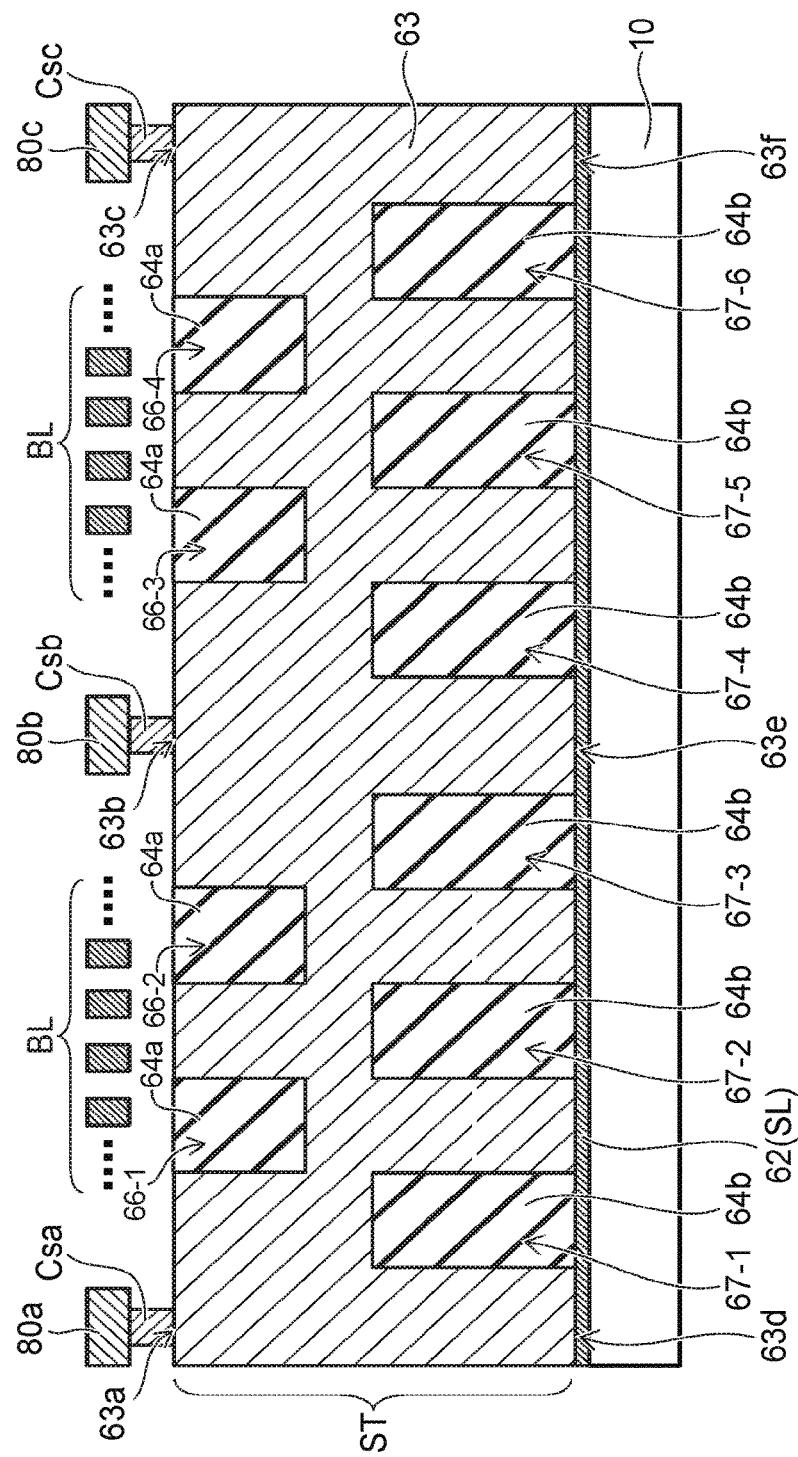
FIG. 17 is schematic cross-sectional view of the semiconductor device of a fifth variation of the third embodiment.

FIG. 17 is a schematic cross-sectional view of a semiconductor device according to a fifth variation on the third embodiment. The cross section illustrated in FIG. 17 corresponds to the cross section illustrated in FIG. 12.

As illustrated in FIG. 17, the fifth variation on the third embodiment is a combination of the first variation on the second embodiment and the first variation on the third embodiment. In the fifth variation, the semiconductor device illustrated in FIG. 11 is combined with the semiconductor device illustrated in FIG. 13. In this manner, according to the embodiment, the first variation on the second embodiment and the first variation on the third embodiment can be combined.

Figure 18:
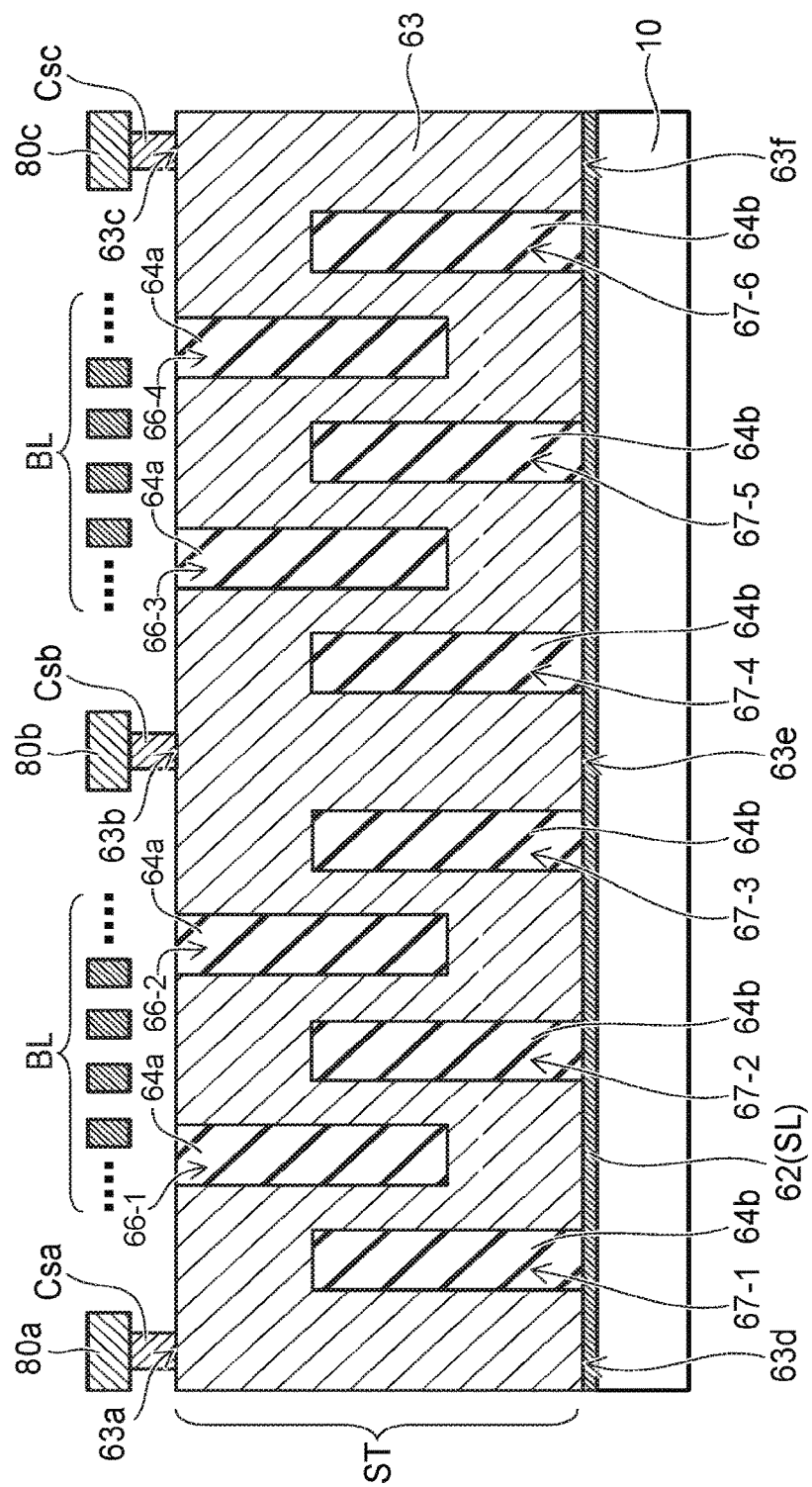
FIG. 18 is schematic cross-sectional view of the semiconductor device of a sixth variation of the third embodiment.

FIG. 18 is a schematic cross-sectional view of a semiconductor device according to a sixth variation on the third embodiment. The cross section illustrated in FIG. 18 corresponds to the cross section illustrated in FIG. 12.

As illustrated in FIG. 18, the sixth variation on the third embodiment is an example in which upper-side recess portions 66-1 to 66-4 are caused to overlap lower-side recess portions 67-1 to 67-6 in the fifth variation on the third embodiment. In the sixth variation, the upper-side recess portions 66-1 and 66-2 overlap the lower-side recess portions 67-1 to 67-3. Likewise, the upper-side recess portions 66-3 and 66-4 overlap the lower-side recess portions 67-4 to 67-6.

Thus, the upper-side recess portions 66-1 to 66-4 may be caused to overlap the lower-side recess portions 67-1 to 67-6 as in the sixth variation on the third embodiment.

Figure 20B:
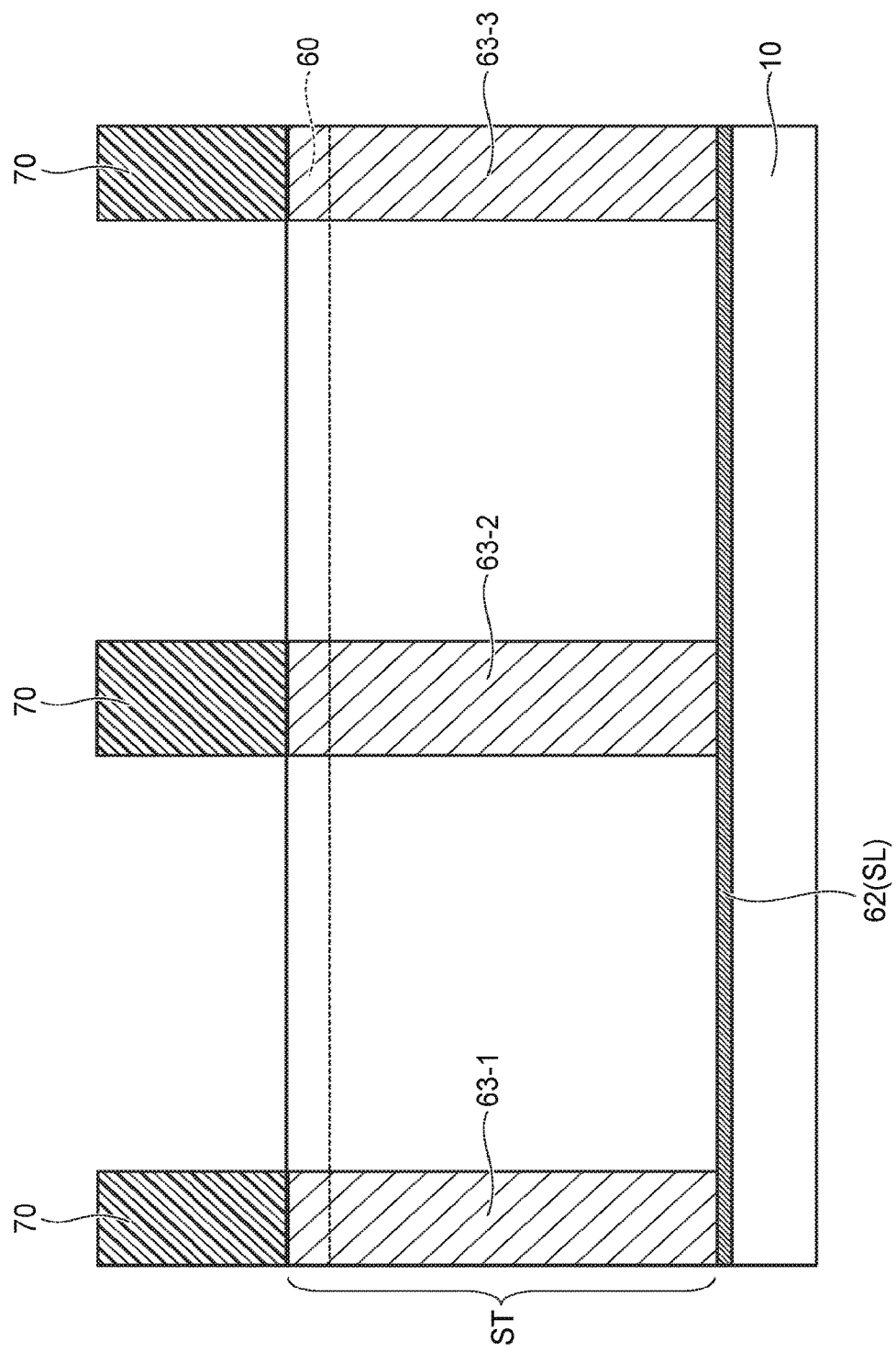

FIG. 19 is a schematic plan view illustrating a method for manufacturing the semiconductor memory device according to the first embodiment. FIGS. 20A and 20B are schematic cross-sectional views taken along a 20-20 line indicated in FIG. 19.

As illustrated in FIGS. 19 and 20, the slit ST is filled with the conductor 63 in order to manufacture the semiconductor device according to the first embodiment. Next, for example, a photoresist film 70 having a line and space pattern is formed upon the insulating film 60, the insulating film 61, the first conductor 62, and the conductor 63 in order to form the second to the fourth conductors 63-1 to 63-3. Next, as illustrated in FIG. 20B, the conductor 63 is etched until the first conductor 62 is exposed on the bottom of the slit ST, using the photoresist film 70, the insulating film 60, the insulating film 61, and the first conductor 62 as an etching mask. This separates the conductor 63 into the second conductor 63-1, the third conductor 63-2, and the fourth conductor 63-3.

The semiconductor device according to the first embodiment can thus be manufactured through such a manufacturing method.

In the case of manufacturing the semiconductor device according to the second embodiment, for example, the etching of the conductor 63 illustrated in FIG. 20B may be stopped partway along the slit ST.

Figure 21:
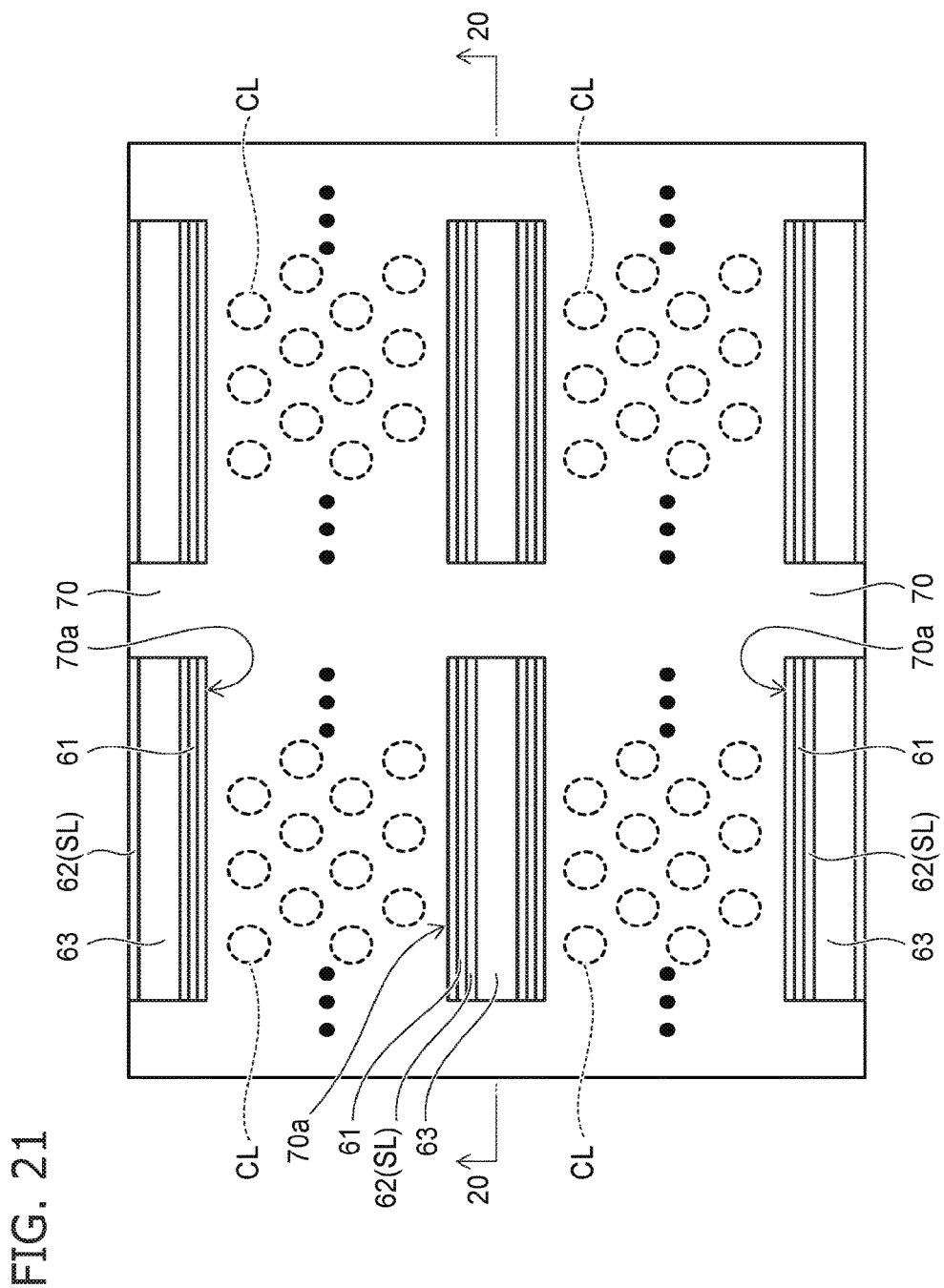
FIG. 21 is a schematic plan view illustrating a first variation on the method for manufacturing the semiconductor memory device according to the first embodiment.

FIG. 21 is a schematic plan view illustrating a first variation on the method for manufacturing the semiconductor memory device according to the first embodiment.

As illustrated in FIG. 21, the photoresist film 70 may be provided with a hole pattern. The conductor 63, for example, is exposed from hole portions 70a in the hole pattern. The conductor 63 can be separated into the second conductor 63-1, the third conductor 63-2, and the fourth conductor 63-3 even when such a photoresist film 70 is used. This allows the semiconductor device according to the first embodiment or the second embodiment to be manufactured.

Figure 22A:
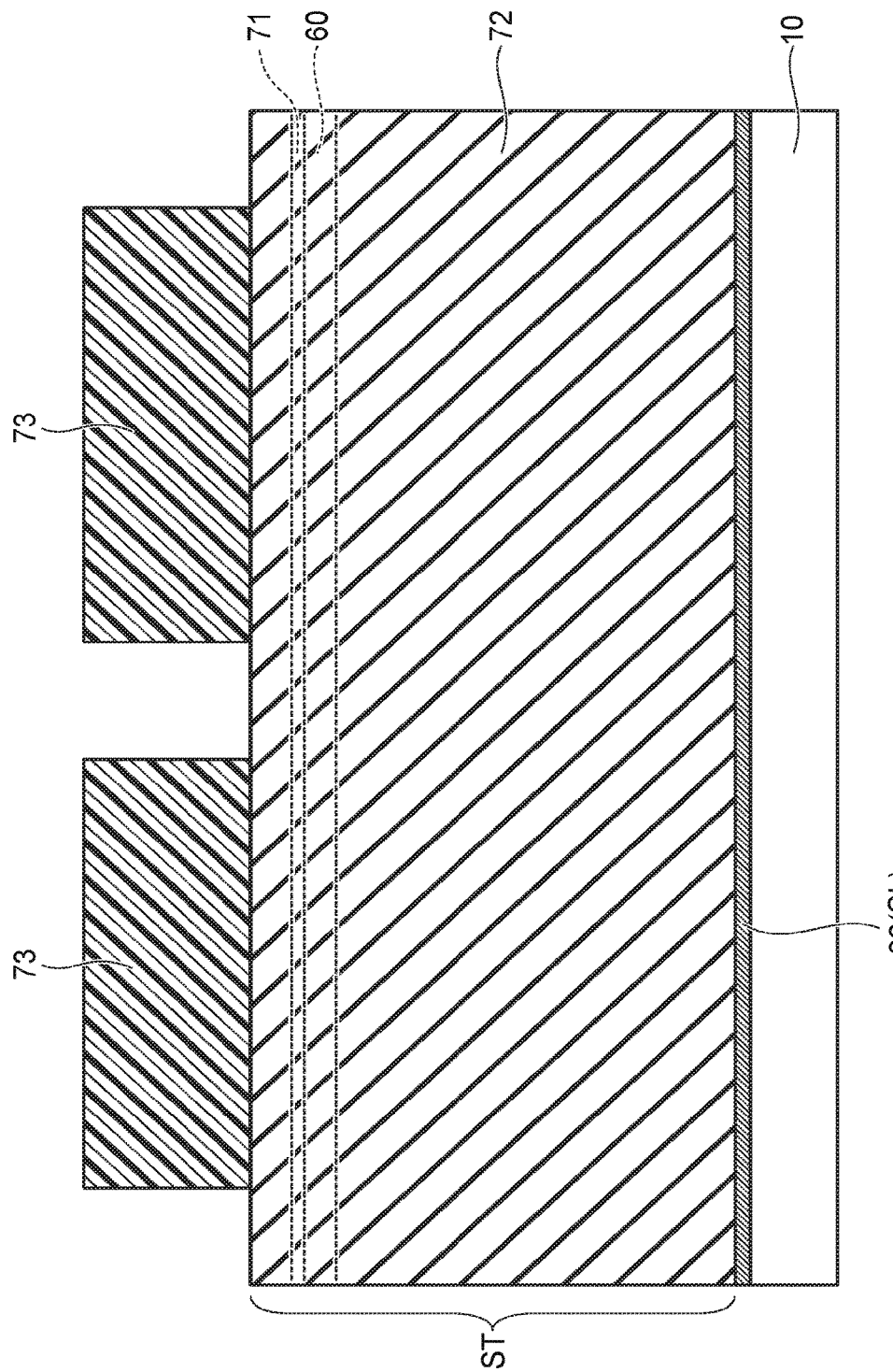
FIG. 22A to FIG. 22C are schematic cross-sectional views illustrating a method for manufacturing the semiconductor memory device according to the third embodiment.
Figure 22B:
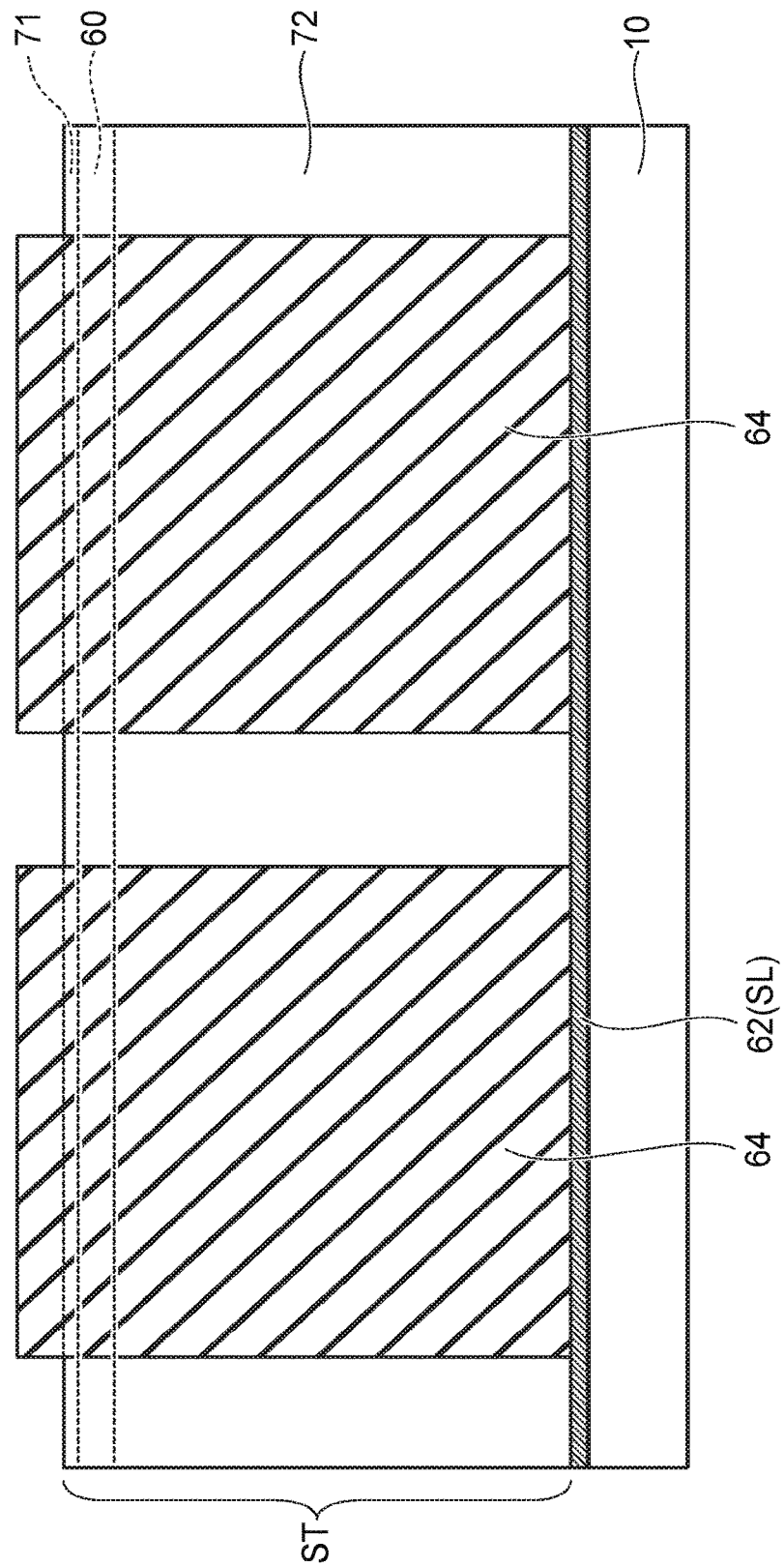
Figure 22C:
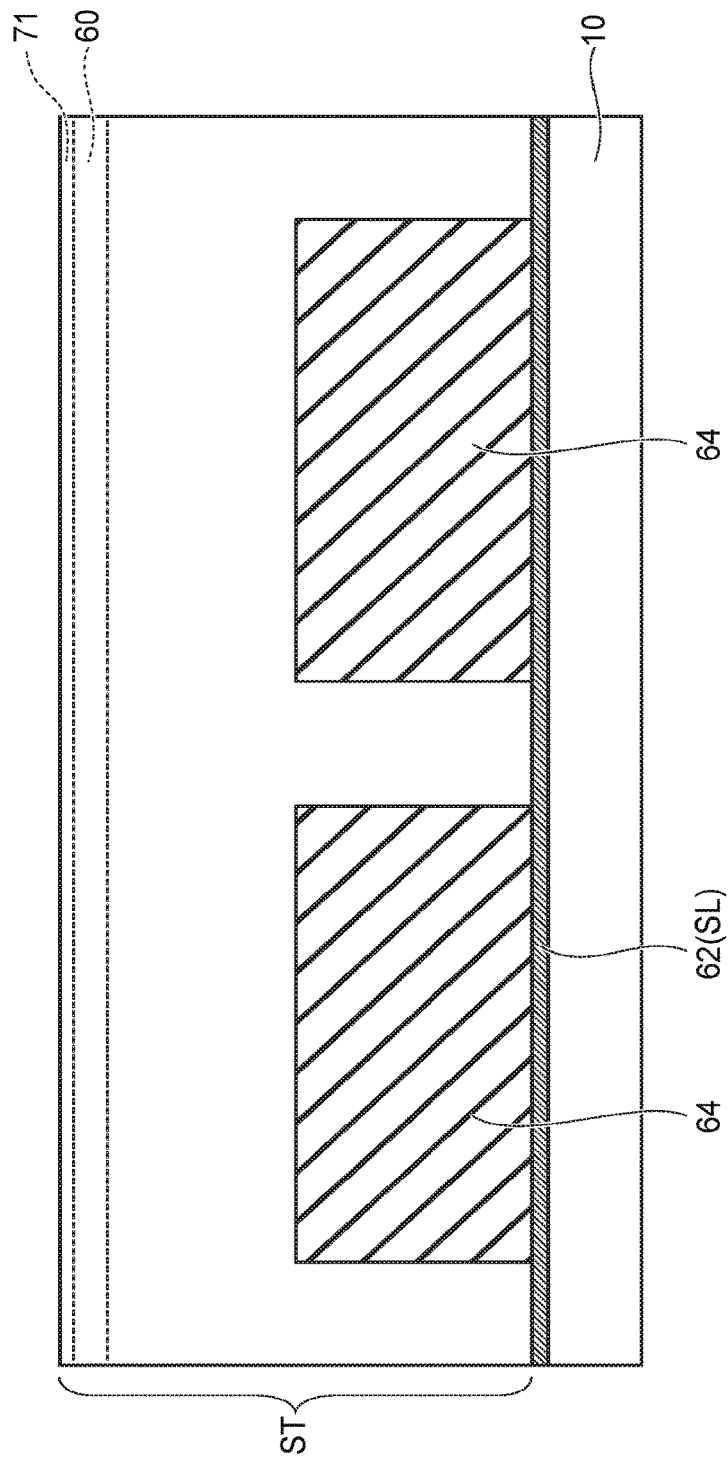

FIGS. 22A to 22C are schematic cross-sectional views illustrating a method for manufacturing the semiconductor memory device according to the third embodiment. The cross sections illustrated in FIGS. 22A to 22C correspond to the cross sections illustrated in FIGS. 20A and 20B.

As illustrated in FIG. 22A, to manufacture the semiconductor device according to the third embodiment, a hard mask film 71 including a different material from the structure 64, for example, is formed upon the insulating film 60. The structure 64 is an insulating film including silicon oxide, which makes the hard mask film 71 to be a silicon film, for example. The silicon film may be formed of amorphous silicon or may be formed of polysilicon obtained by causing amorphous silicon to crystallize.

Next, the slit ST is formed in the stacked body 100 on which the insulating film 60 and the hard mask film 71 have been formed. The insulating film 61 and the first conductor 62 are then formed in the slit ST. Next, an insulator 72, for example, for forming the structure 64, is formed upon the hard mask film 71, the insulating film 61, and the first conductor 62. The insulator 72 includes silicon oxide, for example. As a result, the slit ST is filled with the insulator 72. Next, for example, a photoresist film 73 having a line and space pattern is formed upon the insulator 72 so that the structure 64 is formed.

Next, as illustrated in FIG. 22B, the insulator 72 is etched until the first conductor 62 is exposed on the bottom of the slit ST, using the photoresist film 73 and the hard mask film 71 as an etching mask. This separates the insulator 72 into a plurality of the structures 64.

Next, the plurality of structures 64 are etched using the hard mask film 71 and the first conductor 62 as an etching mask, and the upper surfaces of the plurality of structures 64 are caused to recede to the middle of the slit ST.

Thereafter, the slit ST is filled with the conductor 63, as illustrated in FIG. 12.

The semiconductor device according to the third embodiment can thus be manufactured through such a manufacturing method.

As such, the embodiment can suppress, for example, the stacked body 100 from peeling and the substrate 10 from warping.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor device comprising:
a stacked body provided on a major surface of a substrate, the stacked body including a plurality of electrode layers stacked with an insulator interposed;
a semiconductor body provided in the stacked body, the semiconductor body extending along a stacking direction of the stacked body;
a charge storage layer provided between the semiconductor body and the electrode layers;
a first conductor provided in the stacked body, the first conductor extending along a first direction crossing the stacking direction;
a plurality of second conductors provided in the stacked body, the second conductors including a different material from the first conductor, the second conductors being in contact with first portions of the first conductor;
a plurality of third conductors provided in the stacked body, the third conductors including a same material as the second conductors, the third conductors being in contact with second portions of the first conductor;
a first interconnection provided on the stacked body, the first interconnection being electrically connected to the second conductors and the second conductors being provided below the first interconnection; and
a second interconnection provided on the stacked body, the second interconnection being electrically connected to the third conductors and the third conductors being provided below the second interconnection,
a portion of one of the second conductors connected with the first interconnection and a portion of one of the third conductors connected with the second interconnection being provided separately from each other in an extending direction of the first conductor.

2. The device according to claim 1, further comprising a structure provided between the second conductors and the third conductors, the structure including a different material from the second conductors and the third conductors.

3. The device according to claim 2, wherein the structure includes silicon.

4. The device according to claim 1, wherein an air gap is provided between the second conductors and the third conductors.

5. A semiconductor device comprising:
a stacked body provided on a major surface of a substrate, the stacked body including a plurality of electrode layers stacked with an insulator interposed;
a semiconductor body provided in the stacked body, the semiconductor body extending along a stacking direction of the stacked body, the semiconductor body including a first portion, a second portion, and a third portion along the stacking direction, the second portion being provided between the first portion and the third portion;
a charge storage layer provided between the semiconductor body and the electrode layers;
a first conductor provided in the stacked body, the first conductor extending along a first direction crossing the stacking direction, the first conductor being in contact with the substrate;
a second conductor provided in the stacked body, the second conductor including a different material from the first conductor, the second conductor extending along the stacking direction and along the first direction, the second conductor being in contact with the first conductor; and
at least one recess portion provided in an upper surface of the second conductor;
the first portion including a channel of an upper-side select transistor; and
a bottom surface of the recess portion being lower than the first portion.

6. The device according to claim 5, further comprising:
a first interconnection provided on the stacked body, the first interconnection being in contact with a first contact portion of the second conductor; and
a second interconnection provided on the stacked body, the second interconnection being in contact with a second contact portion of the second conductor; wherein
the recess portion is provided between the first contact portion and the second contact portion.

7. The device according to claim 5, comprising a structure provided in the recess portion, the structure including a different material from the second conductor.

8. The device according to claim 7, wherein the structure includes silicon.

9. The device according to claim 5, wherein an air gap is provided in the recess portion.

10. A semiconductor device comprising:
a stacked body provided on a major surface of a substrate, the stacked body including a plurality of electrode layers stacked with an insulator interposed;
a semiconductor body provided in the stacked body, the semiconductor body extending along a stacking direction of the stacked body;
a charge storage layer provided between the semiconductor body and the electrode layers;
a first conductor provided in the stacked body, the first conductor extending along a first direction crossing the stacking direction, the first conductor being in contact with the substrate;
a second conductor provided in the stacked body, the second conductor including a different material from the first conductor, the second conductor extending along the stacking direction and along the first direction, the second conductor including a first contact portion and a second contact portion, the first contact portion and the second contact portion in contact with the first conductor; and
a first recess portion provided between the first contact portion and the second contact portion.

11. The device according to claim 10, comprising a first structure provided in the first recess portion, the first structure including a different material from the second conductor.

12. The device according to claim 11, wherein the first structure includes silicon.

13. The device according to claim 10, further comprising:
a first interconnection provided on the stacked body, the first interconnection being in contact with a third contact portion of the second conductor; and
a second interconnection provided on the stacked body, the second interconnection being in contact with a fourth contact portion of the second conductor.

14. The device according to claim 13, wherein the second conductor includes at least one second recess portion between the third contact portion and the fourth contact portion.

15. The device according to claim 14, comprising a second structure provided in the second recess portion, the second structure including a different material from the second conductor.

16. The device according to claim 15, wherein the second structure includes silicon.

* * * * *